(12) United States Patent
Yuan et al.

(10) Patent No.: US 8,610,340 B2
(45) Date of Patent: *Dec. 17, 2013

(54) SOLID-STATE LIGHT EMITTING DEVICES AND SIGNAGE WITH PHOTOLUMINESCENCE WAVELENGTH CONVERSION

(75) Inventors: Xianglong Yuan, Fremont, CA (US); Jonathan Melman, San Ramon, CA (US); Bing Dai, Fremont, CA (US); Gang Wang, Milpitas, CA (US); Charles Edwards, Pleasanton, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/253,031

(22) Filed: Oct. 4, 2011

(65) Prior Publication Data

US 2012/0086034 A1    Apr. 12, 2012

Related U.S. Application Data

(60) Provisional application No. 61/390,091, filed on Oct. 5, 2010, provisional application No. 61/427,411, filed on Dec. 27, 2010.

(51) Int. Cl.
    *H01J 5/16*    (2006.01)
(52) U.S. Cl.
    USPC ............................. 313/112; 313/498; 257/98
(58) Field of Classification Search
    USPC ........ 257/98; 313/498, 501, 512, 112; 438/27
    See application file for complete search history.

(56) References Cited

U.S. PATENT DOCUMENTS

| 3,290,255 A | 12/1966 | Smith |
| 3,593,055 A | 7/1971 | Geusic et al. |

(Continued)

FOREIGN PATENT DOCUMENTS

| CA | 2466979 | 11/2005 |
| EP | 647694 | 4/1995 |

(Continued)

OTHER PUBLICATIONS

Barry, T., Flurrescence of EU2+ Activated Phases in Bunary Alkaline Earth Orthosilicate Systems, Journal of the Electrochemical Society, Nov. 1968, pp. 1181-1184, vol. 115, No. 1.

(Continued)

*Primary Examiner* — Mary Ellen Bowman
(74) *Attorney, Agent, or Firm* — Vista IP Law Group, LLP

(57) ABSTRACT

A solid-state light emitting device having a solid-state light emitter (LED) operable to generate excitation light and a wavelength conversion component including a mixture of particles of a photoluminescence material and particles of a light reflective material. In operation the phosphor absorbs at least a portion of the excitation light and emits light of a different color. The emission product of the device comprises the combined light generated by the LED and the phosphor. The wavelength conversion component can be light transmissive and comprise a light transmissive substrate on which the mixture of phosphor and reflective materials is provided as a layer or homogeneously distributed throughout the volume of the substrate. Alternatively the wavelength conversion component can be light reflective with the mixture of phosphor and light reflective materials being provided as a layer on the light reflective surface.

24 Claims, 12 Drawing Sheets

(56) References Cited

U.S. PATENT DOCUMENTS

| | | |
|---|---|---|
| 3,670,193 A | 6/1972 | Thorington et al. |
| 3,676,668 A | 7/1972 | Collins et al. |
| 3,691,482 A | 9/1972 | Pinnow et al. |
| 3,709,685 A | 1/1973 | Hercock et al. |
| 3,743,833 A | 7/1973 | Martie et al. |
| 3,763,405 A | 10/1973 | Mitsuhata |
| 3,793,046 A | 2/1974 | Wanmaker et al. |
| 3,819,973 A | 6/1974 | Hosford |
| 3,819,974 A | 6/1974 | Stevenson et al. |
| 3,849,707 A | 11/1974 | Braslau et al. |
| 3,875,456 A | 4/1975 | Kana et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schoberl |
| 4,081,764 A | 3/1978 | Christmann et al. |
| 4,104,076 A | 8/1978 | Pons |
| 4,143,394 A | 3/1979 | Schoeberl |
| 4,176,294 A | 11/1979 | Thornton, Jr. |
| 4,176,299 A | 11/1979 | Thornton |
| 4,191,943 A * | 3/1980 | Cairns et al. ............ 340/815.42 |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay, Jr. et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter, Jr. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,371,434 A | 12/1994 | Rawlings |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,947,587 A | 9/1999 | Keuper et al. |
| 5,959,316 A | 9/1999 | Lowery |
| 5,962,971 A | 10/1999 | Chen |
| 5,998,925 A | 12/1999 | Shimizu |
| 6,137,217 A | 10/2000 | Pappalardo et al. |
| 6,147,367 A | 11/2000 | Yang et al. |
| 6,255,670 B1 | 7/2001 | Srivastava et al. |
| 6,340,824 B1 | 1/2002 | Komoto et al. |
| 6,504,301 B1 | 1/2003 | Lowery |
| 6,538,375 B1 | 3/2003 | Duggal et al. |
| 6,555,958 B1 | 4/2003 | Srivastava et al. |
| 6,576,488 B2 | 6/2003 | Collins et al. |
| 6,576,930 B2 | 6/2003 | Reeh et al. |
| 6,580,097 B1 | 6/2003 | Soules et al. |
| 6,600,175 B1 | 7/2003 | Baretz et al. |
| 6,614,170 B2 | 9/2003 | Wang et al. |
| 6,642,618 B2 | 11/2003 | Yagi et al. |
| 6,642,652 B2 | 11/2003 | Collins et al. |
| 6,680,569 B2 | 1/2004 | Mueller-Mach et al. |
| 6,717,353 B1 | 4/2004 | Mueller et al. |
| 6,812,500 B2 | 11/2004 | Reeh et al. |
| 6,834,979 B1 | 12/2004 | Cleaver et al. |
| 6,860,628 B2 * | 3/2005 | Robertson et al. ............ 362/555 |
| 6,869,812 B1 | 3/2005 | Liu |
| 6,903,380 B2 | 6/2005 | Barnett et al. |
| 7,029,935 B2 | 4/2006 | Negley et al. |
| 7,153,015 B2 | 12/2006 | Brukilacchio |
| 7,220,022 B2 | 5/2007 | Allen et al. |
| 7,311,858 B2 | 12/2007 | Wang |
| 7,390,437 B2 | 6/2008 | Dong |
| 7,479,662 B2 | 1/2009 | Soules et al. |
| 7,575,697 B2 | 8/2009 | Li |
| 7,601,276 B2 | 10/2009 | Li |
| 7,615,795 B2 | 11/2009 | Baretz et al. |
| 7,655,156 B2 | 2/2010 | Cheng |
| 7,663,315 B1 | 2/2010 | Hulse |
| 7,686,478 B1 | 3/2010 | Hulse et al. |
| 7,943,945 B2 | 5/2011 | Baretz et al. |
| 7,943,951 B2 | 5/2011 | Kim et al. |
| 7,972,030 B2 | 7/2011 | Li |
| 8,274,215 B2 | 9/2012 | Liu |
| 2001/0000622 A1 | 5/2001 | Reeh |
| 2002/0047516 A1 | 4/2002 | Iwasa |
| 2002/0180351 A1 * | 12/2002 | McNulty et al. ............ 313/512 |
| 2003/0038596 A1 | 2/2003 | Ho |
| 2003/0052595 A1 | 3/2003 | Ellens et al. |
| 2003/0102810 A1 | 6/2003 | Cross et al. |
| 2004/0016908 A1 | 1/2004 | Hohn et al. |
| 2004/0016938 A1 | 1/2004 | Baretz et al. |
| 2004/0104391 A1 | 6/2004 | Maeda et al. |
| 2004/0183081 A1 | 9/2004 | Shishov |
| 2004/0227465 A1 | 11/2004 | Menkara et al. |
| 2004/0239242 A1 | 12/2004 | Mano |
| 2005/0051782 A1 | 3/2005 | Negley et al. |
| 2005/0052885 A1 | 3/2005 | Wu |
| 2005/0057917 A1 | 3/2005 | Yatsuda et al. |
| 2005/0093430 A1 | 5/2005 | Ibbetson et al. |
| 2005/0168127 A1 | 8/2005 | Shei et al. |
| 2005/0243550 A1 | 11/2005 | Stekelenburg |
| 2006/0001352 A1 | 1/2006 | Maruta et al. |
| 2006/0027786 A1 | 2/2006 | Dong et al. |
| 2006/0028122 A1 | 2/2006 | Wang et al. |
| 2006/0028837 A1 | 2/2006 | Mrakovich |
| 2006/0049416 A1 | 3/2006 | Baretz et al. |
| 2006/0124947 A1 | 6/2006 | Mueller et al. |
| 2006/0158090 A1 | 7/2006 | Wang et al. |
| 2006/0261309 A1 | 11/2006 | Li et al. |
| 2006/0262532 A1 | 11/2006 | Blumel |
| 2007/0029526 A1 | 2/2007 | Cheng et al. |
| 2007/0091601 A1 | 4/2007 | Hsieh et al. |
| 2007/0120135 A1 * | 5/2007 | Soules et al. .................... 257/98 |
| 2007/0170840 A1 | 7/2007 | Chang-Hae et al. |
| 2007/0240346 A1 | 10/2007 | Li et al. |
| 2008/0111472 A1 | 5/2008 | Liu |
| 2008/0130285 A1 * | 6/2008 | Negley et al. ................. 362/257 |
| 2008/0218992 A1 | 9/2008 | Li |
| 2008/0224597 A1 | 9/2008 | Baretz et al. |
| 2008/0224598 A1 | 9/2008 | Baretz et al. |
| 2008/0246044 A1 | 10/2008 | Pang |
| 2008/0308825 A1 | 12/2008 | Chakraborty et al. |
| 2009/0026908 A1 | 1/2009 | Bechtel et al. |
| 2009/0050991 A1 | 2/2009 | Chakraborty |

(56) References Cited

U.S. PATENT DOCUMENTS

| | | | |
|---|---|---|---|
| 2009/0272996 A1* | 11/2009 | Chakraborty | 257/98 |
| 2009/0283721 A1 | 11/2009 | Liu | |
| 2011/0147778 A1 | 6/2011 | Ichikawa | |
| 2012/0086034 A1 | 4/2012 | Yuan | |

FOREIGN PATENT DOCUMENTS

| | | |
|---|---|---|
| GB | 2 017 409 | 10/1979 |
| JP | S50-79379 | 11/1973 |
| JP | 60170194 | 9/1985 |
| JP | 862-189770 | 8/1987 |
| JP | H01-179471 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | 07094785 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | 2001177153 A | 6/2001 |
| JP | 2002133910 A | 5/2002 |
| JP | 2003101078 | 4/2003 |
| JP | P2003-234513 | 8/2003 |
| JP | 2005011953 | 1/2005 |
| JP | P3724490 | 9/2005 |
| JP | P3724498 | 9/2005 |
| KR | 10-2007-0065486 | 6/2007 |
| KR | 10-2009-0017346 | 2/2009 |
| RU | 214492 | 6/1998 |
| TW | 200527664 | 8/2005 |
| WO | WO 9108508 | 6/1991 |
| WO | 0207228 | 1/2002 |
| WO | 2004077580 | 9/2004 |
| WO | 2005025831 | 3/2005 |
| WO | 2006022792 | 3/2006 |
| WO | WO 2008019041 A2 | 2/2008 |
| WO | 2008043519 | 4/2008 |
| WO | 2010074963 | 1/2010 |

OTHER PUBLICATIONS

First Office Action for Chinese Patent Application No. 200780032995.8 Issued on Mar. 19, 2010.
Foreign Office Action dated Oct. 29, 2012 for Chinese Appln. No. 200780032995.8.
Second Office Action for Chinese Patent Application No. 200780032995.8 Issued on Aug. 10, 2011.
Third Office Action for Chinese Patent Application No. 200780032995.8 Issued on Dec. 12, 2011.
Foreign Office Action dated Apr. 24, 2012 for Chinese Appln. No. 201010525492.8.
Foreign Office Action dated Jul. 5, 2012 for European Appln. No. 07811039.2.
Foreign Office Action for Japanese Application No. 2009-522877 mailed on Apr. 16, 2013.
Foreign Office Action for Japanese Application No. 2009-522877 mailed on Apr. 24, 2012.
Taiwanese Office Action and Search Report for Roc (Taiwan) Patent Applicatoin No. 096128666 mailed on Sep. 1, 2011.
Non-Final Office Action dated Sep. 27, 2012 for U.S. Appl. No. 13/436,471.
Final Office Action Mailed on Jun. 23, 2009 for U.S. Appl. No. 11/640,533.
Final Office Action Mailed on Sep. 23, 2011 for U.S. Appl. No. 11/640,533.
Final Office Action Mailed on Sep. 9, 2010 for U.S. Appl. No. 11/640,533.
Non-Final Office Action Mailed on Jan. 20, 2010 for U.S. Appl. No. 11/640,533.
Non-Final Office Action Mailed on Mar. 3, 2011 for U.S. Appl. No. 11/640,533.
Non-Final Office Action Mailed on Oct. 27, 2008 for U.S. Appl. No. 11/640,533.
Notice of Allowance Mailed on Aug. 12, 2011 for U.S. Appl. No. 12/624,839.
Notice of Allowance Mailed on Sep. 26, 2011 for U.S. Appl. No. 12/624,839.
Final Office Action dated Jan. 11, 2013 for U.S. Appl. No. 12/624,900.
Final Office Action Mailed on Dec. 19, 2011 for U.S. Appl. No. 12/624,900.
Non-Final Office Action Mailed on Jun. 25, 2012 for U.S. Appl. No. 12/624,900.
Non-Final Office Action Mailed on Mar. 24, 2011 for U.S. Appl. No. 12/624,900.
Final Office Action dated Jan. 30, 2013 for U.S. Appl. No. 13/087,615.
Non-Final Office Action dated Sep. 21, 2012 for U.S. Appl. No. 13/087,615.
Advisory Action dated May 15, 2013 for U.S. Appl. No. 13/436,471.
Final Office Action dated Mar. 1, 2013 for U.S. Appl. No. 13/436,471.
Final Office Action dated Apr. 5, 2013 for U.S. Appl. No. 13/441,714.
Non-Final Office Action dated Sep. 19, 2012 for U.S. Appl. No. 13/441,714.
International Search Report and the Written Opinion dated Aug. 15, 2008 for PCT International Application No. PCT/US2007/017299.
Final Office Action dated Mar. 1, 2013 for U.S. Appl. No. 13/253,031.
Non-Final Office Action dated Oct. 16, 2012 for U.S. Appl. No. 13/253,031.
Final Office Action dated Mar. 1, 2013 for U.S. Appl. No. 13/273,215.
Non-Final Office Action dated Sep. 24, 2012 for U.S. Appl. No. 13/273,215.
International Search Report and Written Opinion for PCT Application No. PCT/US11/54827.
Final Office Action dated Mar. 6, 2013 for U.S. Appl. No. 13/273,212.
Non-Final Office Action dated Sep. 24, 2012 for U.S. Appl. No. 13/273,212.
Final Office Action dated Mar. 1, 2013 for U.S. Appl. No. 13/273,217.
Non-Final Office Action dated Sep. 24, 2012 for U.S. Appl. No. 13/273,217.
International Search Report and Written Opinion dated Mar. 28, 2013 for PCT/US2012/0598292.
Park J.K., et al., Optical Properties of Eu2+ Activated Sr2Sio4 Phosphor for Light-Emitting Diodes, Electrochemical and Solid-State Letters, Feb. 25, 2004, pp. H15-H17, vol. 7, No. 5.
Supplementary European Search Report for EP 07811039.2, Apr. 15, 2011, 15 pages.
Yoo, J.S., et al., Control of Spectral Properties of Strontium-Alkaline Earth-Silicate-Europiem Phosphors for LED Applications, Journal of the Electrochemical Society, Apr. 1, 2005 pp. G382-G385, vol. 152, No. 5.
"Fraunhofer-Gesellschaft: Research News Special1997", http://www.fhg.de/press/md-e/md1997/sondert2.hlm,(accessed on Jul. 23, 1998), Jan. 1997, Publisher: Fraunhofer Institute.
Adachi, C. et al., "Blue light-emitting organic electroluminescent devices", "Appl. Phys. Lett.", Feb. 26, 1990, pp. 799-801, vol. 56, No. 9.

(56) References Cited

OTHER PUBLICATIONS

Akasaki, Isamu, et al., "Photoluminescence of Mg-doped p-type GaN and electroluminescence of GaN p-n. junction LED", "Journal of Luminescence", Jan.-Feb. 1991, pp. 666-670, vol. 48-49 pt. 2.

Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.

Apr. 14, 2010 Office Action in U.S. Appl. No. 11/264,124.

Apr. 15, 2009 Office Action in U.S. Appl. No. 11/264,124.

Armaroli, N. et al., "Supramolecular Photochemistry and Photophysics.", "J. Am. Chern. Soc.", 1994, pp. 5211-5217, vol. 116.

Aug. 21, 2006 Office Action in U.S. Appl. No. 10/623,198.

Aug. 24, 2007 Office Action in U.S. Appl. No. 11/264,124.

Aug. 26, 2010 Office Action in U.S. Appl. No. 12/131,118.

Berggren, M. et al., "Light-emitting diodes with variable colours from polymer blends", "Nature", Dec. 1, 1994, pp. 444-446, vol. 372.

Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.

Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.

Bradfield, P.L., et al., "Electroluminescence from sulfur impurities in a p-n junction formed in epitaxial silicon", "Appl. Phys. Lett", 07110/1989, pp. 10D-102, vol. 55, No. 2.

Chao, Zhang Jin, et al., "White light emitting glasses", "Journal of Solid State Chemistry", 1991, pp. 17-29, vol. 93.

Comrie, M. , "Full Color LED Added to Lumex's Lineup", "EBN", Jun. 19, 1995, p. 28.

CRC Handbook, 63rd Ed., (1983) p. E-201.

Das, N.C., et al., "Luminescence spectra of ann-channel metal-oxide-semiconductor field-effect transistor at breakdown", 1990, pp. 1152-1153, vol. 56, No. 12.

Dec. 16. 2004 Office Action in U.S. Appl. No. 10/623,198.

Dictionary Definition of Phosphor, Oxford English Dictionary Online, Mar. 9, 2012 (Only partial available due to corrupt file on Mar. 22, 2012 in U.S. Appl. No. 12/131,119; Request for Full Reference filed).

El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.

Feb. 21, 2012 Office Action in U.S. Appl. No. 12/131,118.

Feb. 26, 2008 Office Action in U.S. Appl. No. 11/264,124.

Feb. 4, 2005 Office Action in U.S. Appl. No. 10/623,198.

Feb. 7, 2007 Office Action in U.S. Appl. No. 11/264,124.

Forrest, S. et al. , "Organic emitters promise a new generation of displays", "Laser Focus World ", Feb. 1995, pp. 99-107.

Hamada, Y. et al., "Blue-Light-Emitting Organic Electroluminescent Devices with Oxadiazole Dimer Dyes as an Emitter", "Jpn. J. Appl. Physics", Jun. 1992, pp. 1812-1816, vol. 31.

Hamakawa, Yoshihiro, et al., "Toward a visible light display by amorphous SiC:H alloy system", "Optoelectronics—Devices and Technologies", Dec. 1989, pp. 281-294, vol. 4, No. 2.

Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.

Jang, S., "Effect of Avalanche-Induced Light Emission on the Multiplication Factor in Bipolar Junction Transistors", "Solid-State Electronics", 1991, pp. 1191-1196, vol. 34, No. 11.

Jan. 29, 2007 Office Action in U.S. Appl. No. 10/623,198.

Jan. 30, 2006 Office Action in U.S. Appl. No. 11/264,124.

Jan. 7, 2011 Office Action in U.S. Appl. No. 12/131,119.

Jul. 10, 2008 Office Action in U.S. Appl. No. 11/264,124.

Jul. 14, 2005 Notice of Allowance, Notice of Allowability, and Examiners Statement of Reasons for Allowance in U.S. Appl. No. 10/623,198.

Jul. 14, 2011 Office Action in U.S. Appl. No. 12/131,119.

Jul. 7, 2011 Office Action in U.S. Appl. No. 12/131,118.

Jun. 14, 2006 Office Action in U.S. Appl. No. 11/264,124.

Jun. 26, 2007 Office Action in U.S. Appl. No. 10/623,198.

Kido, J. et al. , "1,2,4-Triazole Derivative as an Electron Transport Layer in Organic Luminescent Devices", "Jpn. J. Appl. Phys.", Jul. 1, 1993, pp. L917-L920, vol. 32.

Kido, J. et al. , "Bright blue electroluminescence from poly(N-vinylcarbazole)", "Appl. Phys. Letters", Nov. 8, 1993, pp. 2627-2629, vol. 63, No. 19.

Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.

Krames, M., et al., "Status and Future of High-Power Light-Emitting Diodes for Solid-Slate Lighting", "Journal of Display Technology", Jun. 2007, pp. 160-175, vol. 3, No. 2.

Kudryashov, V., et al., "Spectra of Superbright Blue and Green InGaN/AlGaN/GaN Light-Emitting diodes", "Journal of the European Ceramic Society", May 1996, pp. 2033-2037, vol. 17.

Larach, S., et al., "Blue emitting luminescent phosphors: Review and status", "Int'l Workshop on Electroluminescence", 1990, pp. 137-143.

LEDs and Laser Diodes, Electus Distribution, copyright 2001, available at URL:http://www.jaycar.com.au/images_uploaded/ledlaser.Pdf.

Lester, S., et al., "High dislocation densities in high efficiency GaN-based light-emitting diodes", "Appl. Phys. Lett.", Mar. 6, 1995, pp. 1249-1251, vol. 66, No. 10.

Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdf?title=Technicai%20Datasheet&asset_type=pds/pdf& language=EN&urn=urn: documentum:eCommerce_soi_EU :09007bb280021e27.pdf:09007bb280021e27.pdf.

Mar. 2, 2009 Office Action in U.S. Appl. No. 10/623,198.

Mar. 22, 2012 Office Action in U.S. Appl. No. 12/131,119.

Mar. 28, 2006 Office Action in U.S. Appl. No. 10/623,198.

Mar. 4, 2011 Notice of Allowance, Notice of Allowability, Examiners Interview Summary, Examiners Amendment/Comment and Examiner's Statement of Reason for Allowance in U.S. Appl. No. 11/264,124.

Mar. 7, 2008 Office Action in U.S. Appl. No. 10/623,198.

Maruska, H.P., "Gallium nitride light-emitting diodes (dissertation)", "Dissertation Submitted to Stanford University", Nov. 1973.

Maruska, H.P., et al., "Violet luminescence of Mg-doped GaN", "Appl. Phys. Lett.", Mar. 15, 1973, pp. 303-305, vol. 22, No. 6.

May 4, 2010 Office Action in U.S. Appl. No. 12/131,119.

McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.

McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.

Mimura, Hidenori, et al., "Visible electroluminescence from uc-SiC/porous Si/c-Si p-n junctions", "Int. J. Optoelectron.", 1994, pp. 211-215, vol. 9, No. 2.

Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.

Morkoc et al., "Large-band-gap SIC, 111-V nitride, and II-VI ZnSe-based semiconductor device technologies", J. Appl. Phys. 76(3), 1; Mar. 17, 1994; Illinois University.

Muench, W.V., et al., "Silicon carbide light-emitting diodes with epitaxial junctions", "Solid-State Electronics", Oct. 1976, pp. 871-874, vol. 19, No. 10.

Mukai, T., et al., "Recent progress of nitride-based light emitting devices", "Phys. Stat. Sol.", Sep. 2003, pp. 52-57, vol. 200, No. 1.

Nakamura, S., et al., "High-power InGaN single-quantum-well-structure blue and violet light-emitting diodes", "Appl. Phys. Lett.", Sep. 25, 1995, pp. 1868-1870, vol. 67, No. 13.

(56) References Cited

OTHER PUBLICATIONS

Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Nov. 30, 2010 Office Action in U.S. Appl. No. 12/131,118.
Oct. 20, 2008 Office Action in U.S. Appl. No. 10/623,198.
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn A Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiner's Amendmeni/Comment, and Examiners Statement of Reasons for Allowance in U.S. Appl. No. 10/623,198.
Sep. 29, 2009 Office Action in U.S. Appl. No. 11/264,124.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315,437-438, 509-510, copyright 1979, 1988, and 1998.
Ura, M., "Recent trends of development of silicon monocarbide blue-light emission diodes", "Kinzoku", 1989, pp. 11-15, vol. 59, No. 9.
Werner, K., "Higher Visibility for LEDs", "IEEE Spectrum", Jul. 1994, pp. 30-39.
Wojciechowski, J. et al., "Infrared-To-Blue Up-Converting Phosphor", "Electron Technology", 1978, pp. 31-47, vol. 11, No. 3.
Yamaguchi, Y. et al., "High-Brightness SiC Blue LEDs and Their Application to Full Color LED Lamps", "Optoelectronics—Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics—Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol.", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
Foreign Office Action dated Mar. 19, 2013 for Chinese Appln. No. 201010525492.8.
International Preliminary Report on Patentability dated Apr. 9, 2013 for PCT Application No. PCT/US11/54827.
Fourth Office Action dated May 15, 2013 for Chinese Appln. No. 200780032995.8.
Non-Final Office Action dated May 16, 2013 for U.S. Appl. No. 13/087,615.
Non-Final Office Action dated Jun. 13, 2013 for U.S. Appl. No. 13/273,217.
Non-Final Office Action dated Jun. 14, 2013 for U.S. Appl. No. 13/273,215.
Non-Final Office Action dated Jun. 17, 2013 for U.S. Appl. No. 13/273,212.
Non-Final Office Action dated Jul. 18, 2013 for U.S. Appl. No. 13/436,471.
Non-Final Office Action Mailed on Jul. 25, 2013 for U.S. Appl. No. 11/640,533.
Notice of Allowance dated Sep. 24, 2013 for U.S. Appl. No. 13/273,212.
Notice of Allowance dated Sep. 24, 2013 for U.S. Appl. No. 13/273,217.
Notice of Allowance dated Sep. 30, 2013 for U.S. Appl. No. 13/273,215.
Non-Final Office Action dated Sep. 27, 2013 for U.S. Appl. No. 12/624,900.
International Search Report and Written Opinion dated Sep. 27, 2013 for PCT Appln. No. PCT/US13/48354.

* cited by examiner

SOLID-STATE LIGHT EMITTING DEVICES AND SIGNAGE WITH PHOTOLUMINESCENCE WAVELENGTH CONVERSION

CROSS-REFERENCE TO RELATED APPLICATIONS

This application claims the benefit of priority to U.S. Provisional Patent Application Ser. No. 61/390,091, entitled "Solid-State Light Emitting Devices and Signage with Photoluminescence Wavelength Conversion," filed on Oct. 5, 2010 and to U.S. Provisional Patent Application Ser. No. 61/427,411, entitled "Solid-State Light Emitting Devices with Remote Phosphor Wavelength Conversion Component", filed Dec. 27, 2010, which are hereby incorporated by reference in their entirety.

FIELD

Some embodiments of the invention relate to solid-state light emitting devices and signage that use photoluminescence wavelength conversion to convert light generated by a solid-state light emitter to a desired color of light.

BACKGROUND

White light emitting LEDs ("white LEDs") are known in the art and are a relatively recent innovation. Due to their long operating life expectancy (>50,000 hours) and high luminous efficacy (70 lumens per watt and higher) high brightness white LEDs are increasingly being used to replace conventional fluorescent, compact fluorescent and incandescent light sources.

It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more photo-luminescent materials (e.g., phosphor materials), which absorb a portion of the radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor combined with the light emitted by the phosphor provides light which appears to the human eye as being nearly white in color.

The exact color generated by the LED light is highly dependent upon the amount of light that is emitted by the phosphor material, since it is the combination of the amount (and wavelength) of the phosphor-emitted light and the amount (and wavelength) of the residual blue light that determines the color of the resultant light. Therefore, phosphor-based LED devices that are intended to generate white light will require sufficient amounts of phosphors to function correctly, since the phosphor-based LED device having insufficient amounts of phosphor materials will fail to generate white-appearing light.

The problem is that phosphor materials are relatively costly, and hence correspond to a significant portion of the costs for producing phosphor-based LED devices. Typically the phosphor material in a LED light is mixed with a light transmissive material such as a silicone or epoxy material and the mixture directly applied to the light emitting surface of the LED die. This results in a small footprint layer of phosphor materials placed directly on the LED die, that is nevertheless still costly to produce in part because of the significant costs of the phosphor materials.

As disclosed in United States patent application US 2008/02118992 A1 to Li, it is also known to provide the phosphor material as a layer on, or incorporate the phosphor material within an, optical component that is physically located remote to the LED die. This typically results in a layer of phosphor materials having a much larger footprint than the approach described in the preceding paragraph. Because of its larger size, a much greater amount of phosphor is normally required to manufacture such "remote phosphor" LED devices. As a result, the costs are correspondingly greater as well to provide the increased amount of phosphor materials needed for such remote phosphor LED devices. For example, United States patent application US 2007/0240346 A1, to Li et al., teaches solid-state light emitting signs in which blue light from an LED is used to excite phosphor materials on a light emitting signage surface to generate a desired color of light. A large quantity of the phosphor materials must normally be present to populate the expanse of the light emitting signage surface for the device to produce the appropriate color for its intended light functionality.

Therefore, there is a need for improved approach to implement LED lighting apparatuses that maintains the desired color properties of the devices, but without requiring the large quantities of photo-luminescent materials (e.g. phosphor materials) that are required in the prior approaches.

It is an object of some embodiments of the present invention to provide a light emitting device, a light emitting sign, a photoluminescence wavelength conversion component and a photoluminescence signage surface that in part at least overcomes the limitations of the known devices.

SUMMARY

Embodiments of the invention concern solid-state light emitting devices and signage comprising one or more solid-state light emitters, typically LEDs, that are operable to generate blue light which is used to excite a photoluminescence wavelength conversion component or a photoluminescence light emitting signage surface that contain particles of a blue light excitable photo-luminescent (e.g. a phosphor material). In accordance with some embodiments of the invention, and to increase photoluminescence light generation by the phosphor material, the wavelength conversion component and/or signage surface further comprises incorporating particles of a light reflective material (also referred to herein as "light scattering material") with the phosphor material. The enhanced light generation results from the light reflective material increasing the number of collisions of the LED generated light with particles of the phosphor material, which decreases the amount of phosphor material usage to generate a selected emission product color.

According to some embodiments of the invention, a light emitting device comprises at least one solid-state light emitter operable to generate blue light and a photoluminescence wavelength conversion component comprising a mixture of particles of at least one phosphor material and particles of a light reflective material, wherein the mixture of at least one phosphor material and light reflective material are distributed over a large footprint area, e.g. an area of at least 0.8 cm². In particular, including particles of a light reflective material with the phosphor material can increase photoluminescence light generation by the phosphor material. The increase in photoluminescence light generation results from the light reflective material increasing the probability of collisions of the photons with particles of the phosphor material. In some embodiments, the inclusion of the light reflective material can potentially, for a given emission product color and intensity, reduce phosphor material usage by 33% or more. Some embodiments of the invention concern devices in which the wavelength conversion component that includes the phosphor material is provided "remote" to the light emitter to reduce the transfer of heat from the light emitter to the phosphor material. In the context of this application, "remote" and "remotely" means physically separated from, by for example an air gap or light transmissive medium. In remote phosphor devices the phosphor material is distributed over a much greater area than the area of the light emitting surface of the light emitter. In accordance with some embodiments of the invention, the area over which the phosphor material and light reflective material is distributed is at least fifty times the light emitting area of the light emitter. Moreover, in some embodiments, the wavelength conversion component is located at a distance of at least 5 mm from the light emitter and is preferably separated by a gap, e.g. an air gap. Separating the phosphor material from the solid-state emitter reduces the transfer of heat to the phosphor material and reduces thermal degradation of the phosphor material.

Advantageously, the light reflective materials employed in some embodiments has as high a reflectivity as possible and preferably has a reflectance of at least 0.9. The light reflective material can comprise magnesium oxide (MgO), titanium dioxide ($TiO_2$), barium sulfate ($BaSO_4$) or a combination thereof. Preferably the light reflective material has a particle size in a range 0.01 μm to 10 μm, 0.01 μm to 0.1 μm or 0.1 μm to 1 μm.

The phosphor material in some embodiments preferably has a particle size in a range from 2 to 60 μm and typically in a range 10 to 20 μm. It is believed to be advantageous in some embodiments for the light reflective material particle size to be smaller than the phosphor material particle size preferably by a factor of at least ten. The weight percent loading of light reflective material to phosphor material in some embodiments can be in a range 0.01% to 10%, 0.1% to 1% or 0.5% to 1%.

In one arrangement the wavelength conversion component comprises a light transmissive substrate on which the mixture of phosphor and light reflective materials is provided as at least one layer. The component can be configured as a light transmissive window such that a proportion of blue light passing through the component will be converted to light of a different color by the phosphor material. Alternatively the component can be configured as a light guide (waveguide) and the mixture of phosphor and light reflective materials provided on at least a part of a face of the substrate. The mixture of phosphor and light reflective materials is advantageously applied to the surface of the substrate by screen printing. Alternatively the mixture can be deposited on the substrate by inkjet printing, spin coating or doctor blading. Preferably the light transmissive substrate comprises an acrylic, a polycarbonate, an epoxy, a silicone or a glass.

In another arrangement the wavelength conversion component comprises a light transmissive substrate having the mixture of phosphor and light reflective materials homogeneously distributed throughout its volume. Preferably the light transmissive substrate comprises an acrylic, a polycarbonate, an epoxy, a silicone or a glass.

In further arrangements the wavelength conversion component is light reflective and can comprise a light reflective surface on which the mixture of phosphor and light reflective materials is provided as at least one layer. The mixture of phosphor and light reflective materials can be applied to the light reflective surface by screen printing, spin coating or doctor blading. The light reflective substrate can comprise any light reflective surface and preferably has a reflectance of at least 0.9. The light reflective surface can comprise a polished metallic surface such as silver aluminum, chromium; a light reflective polymer, a light reflective paper or a light reflective paint.

In some embodiments, the at least one solid-state light emitter comprises an LED that is operable to generate blue light having a peak wavelength in a wavelength range 440 nm to 480 nm. Alternatively the solid-state light emitter(s) can comprise a laser or laser diode.

According to a further aspect of some embodiments of the invention a photoluminescence wavelength conversion component for a solid-state light emitting device comprises a mixture of particles of at least one photo-luminescent material and particles of a light reflective material, wherein the mixture of at least one phosphor material and light reflective material are distributed over an area of at least 0.8 $cm^2$. The light reflective material preferably has as high a reflectance as possible, preferably at least 0.9, and can comprise particles of MgO, $TiO_2$, $BaSO_4$ or a combination thereof. Preferably the light reflective material has a particle size in a range 0.01 μm to 10 μm; 0.01 μm to 1 μm or 0.1 to 1 μm.

The phosphor material(s) preferably comprise an inorganic material such as for example an orthosilicate, nitride, sulfate, oxy-nitride, oxy-sulfate or garnet (YAG) material has a particle size in a range 2 μm to 60 μm and more particularly 10 μm to 20 μm.

Advantageously the weight percent loading of light reflective material to phosphor material is in a range 0.01% to 10%; 0.01% to 1%; 0.1% to 1% or 0.5% to 1%.

The wavelength conversion component can be light transmissive or light reflective. Where the component is light transmissive the component can be configured as a light transmissive window such that a proportion of blue light passing through the component will be converted to light of a different color by the phosphor material(s). Alternatively the component can be configured as a light guide (waveguide) and the mixture of phosphor and light reflective materials provided on at least a part of a face of the substrate or provided a layer in proximity the face. The mixture of phosphor material and light reflective material can be (a) provided as one or more layers on at least a part of the surface of the component or (ii) homogeneously distributed throughout the volume of the light transmissive substrate. The light transmissive substrate can comprise a light transmissive polymer such as an acrylic, a polycarbonate, an epoxy or a silicone or a glass. Where the wavelength conversion component is light reflective, the wavelength conversion component can comprise a light reflective surface on which the mixture of phosphor material and light reflective material is provided as one or more layers. The light reflective surface can comprise any surface with a high reflectance, preferably at least 0.9, including a metal surface of silver, aluminum, chromium, a light reflective polymer, a light reflective paper or card, a light reflective paint. For ease of fabrication the mixture of phosphor material and light reflective material can be provided on the component by printing, preferably screen printing or inkjet printing; spin coating or doctor blading.

In some embodiments, the light reflective/scattering material that is utilized within the wavelength conversion component has a particle size that is selected such that the particles will scatter blue light relatively more than they will scatter light generated by the phosphor materials. For example, the light reflective particle size may be selected such that the particles will scatter blue light relatively at least twice as much as they will scatter light generated by the at least one phosphor material. This ensures that a higher proportion of the blue light emitted from the wavelength conversion layer will be scattered, thereby increasing the probability of the photon interacting with a phosphor material particle and resulting in the generation of photo-luminescent light. At the same time phosphor generated light can pass through with a lower probability of being scattered.

The light reflective/scattering material may be embodied in a separate layer that is adjacent to, or near, a layer that includes the phosphor material. The separate light reflective layer may be used instead of, and/or in addition to, mixing light reflective/scattering material into the same layer as the phosphor material. Either the same, or different reflective materials, may be used in the separate light reflective layer from the light reflective material that is mixed with the phosphor material.

The embodiments of the invention may be applied to wavelength conversion components having any suitable shape, whether planar or three-dimensional and enveloping some additional volume.

According to a yet further aspect of some embodiments of the invention, a light emitting sign comprises at least one solid-state light emitter operable to generate blue light and a photoluminescence signage surface comprising a light transmissive substrate having a mixture of particles of at least one phosphor material and particles of a light reflective material distributed over an area of at least 100 cm². The mixture of phosphor material and light reflective material can be configured as a pattern to define an image, picture, letter, numeral, device, pattern or other signage information. Alternatively, as for example is required for channel lettering, the shape of the signage surface can be configured to define signage information.

Where the sign is backlit, that is the light emitter is located behind the signage surface which is configured as a light transmissive window such that a proportion of blue light passing through the component will be converted to light of a different color by the phosphor material, the signage surface is preferably located at a distance of at least 5 mm from the light emitter. Alternatively the sign can be edge lit and the substrate configured as a light guide and the mixture of phosphor material and light reflective material are provided on at least a part of a light emitting face of the light guide. In some cases, the substrate will be planar and light can coupled into the light guide from one or more edges of the substrate.

The light reflective material in some embodiments has a particle size 0.01 μm to 10 μm; 0.01 μm to 1 μm or 0.1 μm to 1 μm whilst the phosphor material has a particle size of 2 μm to 60 μm and preferably 10 μm to 20 μm. The weight percent loading of light reflective material to phosphor material can be in a range 0.01% to 10%; 0.01% to 1%; 0.1% to 1% or 0.5% to 1%. The light reflective material can comprise MgO, $TiO_2$, $BaSO_4$ or a combination thereof.

The mixture of phosphor material and light reflective material is advantageously provided on the substrate by screen printing. Alternatively it can be deposited on the substrate by inkjet printing, spin coating or doctor blading.

The light transmissive substrate can comprise any light transmissive material including an acrylic, a polycarbonate, an epoxy, a silicone and a glass.

According to yet another aspect of the invention a photoluminescence signage surface for a solid-state light emitting sign comprises a light transmissive substrate having a mixture of particles of at least one phosphor material and particles of a light reflective material distributed over an area of at least 100 cm².

The signage surface can be configured as a light transmissive window such that a proportion of blue light passing through the component will be converted to light of a different color. Alternatively the substrate can be configured as a light guide and the mixture of phosphor material and light reflective material provided on, or in proximity to, at least a part of a light emitting face of the light guide.

The light reflective material can have a particle size 0.01 μm to 10 μm; 0.01 μm to 1 μm or 0.1 to 1 μm. The phosphor material may have a particle size 2 μm to 60 μm and preferably in a range 10 μm to 20 μm. In some embodiments, the weight percent loading of light reflective material to phosphor material can be in a range 0.01% to 10%; 0.01% to 1%; 0.1% to 1% or 0.5% to 1%. The light reflective material can comprise MgO, $TiO_2$, $BaSO_4$ or a combination thereof.

Preferably the mixture of phosphor material and light reflective material is provided on the substrate by screen printing. Alternatively it can be deposited by inkjet printing, spin coating or doctor blading.

The light transmissive substrate can comprise an acrylic, a polycarbonate, an epoxy, a silicone and a glass.

BRIEF DESCRIPTION OF THE DRAWINGS

In order that the present invention is better understood solid-state light emitting devices and signs in accordance with embodiments of the invention will now be described, by way of example only, with reference to the accompanying drawings in which.

DETAILED DESCRIPTION OF THE INVENTION

Figure 1:
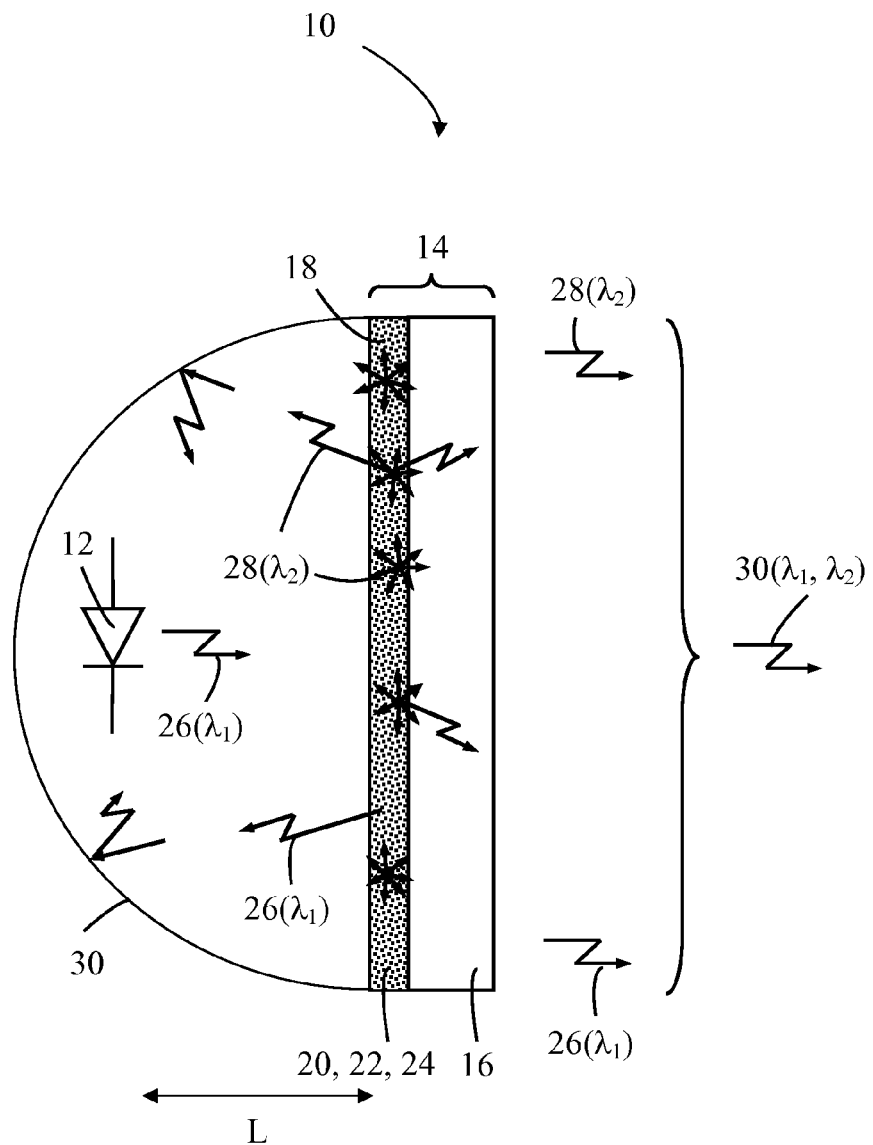
FIG. 1 is schematic representation of an LED-based light emitting device in accordance with an embodiment of the invention.

Some embodiments of the invention are directed to light emitting devices comprising one or more solid-state light emitters, typically LEDs, that is/are operable to generate excitation light (typically blue) which is used to excite a wavelength conversion component containing particles of a photoluminescence materials (e.g. phosphor materials), such as a blue light excitable phosphor material. Additionally the wavelength conversion component comprises particles of a light reflective material (also referred to herein as "light scattering material") that is incorporated with the phosphor material to enhance photoluminescence light generation by the phosphor material. The enhanced light generation results from the light reflective material increasing the number of collisions of light generated by the light emitter(s) with particles of the phosphor material. The net result is a decrease in phosphor material usage for the light emitting devices.

For the purposes of illustration only, the following description is made with reference to photoluminescence material embodied specifically as phosphor materials. However, the invention is applicable to any type of any type of photoluminescence material, such as either phosphor materials or quantum dots. A quantum dot is a portion of matter (e.g. semiconductor) whose excitons are confined in all three spatial dimensions that may be excited by radiation energy to emit light of a particular wavelength or range of wavelengths. As such, the invention is not limited to phosphor based wavelength conversion components unless claimed as such. In addition, throughout this patent specification, like reference numerals are used to denote like parts.

FIG. 1 shows a schematic representation of an LED-based white light emitting device 10 in accordance with an embodiment of the invention. The device 10 comprises a blue light emitting LED 12 and a photoluminescence wavelength conversion component 14 located remote to the LED. As shown the wavelength conversion component 14 can comprise a light transmissive window (substrate) 16 having, on at least one face, a phosphor conversion layer 18. The phosphor conversion layer 18 comprises a mixture of particles of a blue light excitable phosphor material 20, particles of a light reflective material 22 and a light transmissive binder material 24. The light transmissive window 16 can comprise any light transmissive material such as a polymer material for example a polycarbonate, acrylic, silicone or epoxy or a glass such as a quartz glass. Typically, for ease of fabrication, the light transmissive window 16 is planar often disc-shaped in form though it can be square, rectangular or other shapes depending on the intended application. Where the light transmissive window is disc-shaped the diameter can be between about 1 cm and 10 cm that is an optical aperture of area between 0.8 cm$^2$ and 80 cm$^2$. In alternative embodiments it is envisioned that the light transmissive window 16 comprise an optical component that directs light in a selected direction such as a convex or concave lens. To reduce the transfer of heat from the LED 12 to the wavelength conversion component 14, in particular heat transfer to the phosphor material, the wavelength conversion component is located remote to the LED, physically separated, by a distance L of at least 5 mm. Embodiments of the present invention concern devices in which the wavelength conversion component and more importantly the phosphor material is provided remote to the LED to reduce the transfer of heat from the light emitter to the phosphor material. In the context of this application remote means physically separated from by for example an air gap or light transmissive medium. It will be appreciated that in remote phosphor devices the phosphor material is distributed over a much greater area (e.g. 0.8 cm$^2$ to 80 cm$^2$) than the area of the light emitting surface of the LED (e.g. 0.03 cm$^2$). Typically the phosphor material is distributed over an area that is at least fifty times, typically at least 100 times, the light emitting area of the LED.

The blue LED 12 can comprise a GaN-based (gallium nitride-based) LED that is operable to generate blue light 26 having a peak wavelength $\lambda_1$ in a wavelength range 440 nm to 480 nm (typically 465 nm). The blue LED 12 is configured to irradiate the wavelength conversion component 14 with blue excitation light 26 whereat a proportion is absorbed by the phosphor material 20 which in response emits light 28 of a different wavelength $\lambda_2$, typically yellow-green in color for a cold white light emitting device. The emission product 30 of the device 10 which is configured to appear white in color comprises the combined light 26 emitted by the LED and the light 28 generated by the phosphor material 20.

The phosphor material 20 and light reflective material 22, which are in powder form, are thoroughly mixed in known proportions with the light transmissive binder material 24 such as a polymer material (for example a thermally or UV curable silicone or an epoxy material) or a clear ink such as for example Nazdar's® UV curable litho clear overprint PSLC-294. The mixture is applied to the face of the window 16 as one or more layers of uniform thickness. In a preferred embodiment the mixture is applied to the light transmissive window by screen printing and the thickness t of the layer controlled by the number of printing passes. As will be apparent to those skilled in the art the phosphor/reflective material mixture can be applied using other methods including inkjet printing, spin coating or sweeping the mixture over the surface using a blade such as a squeegee (e.g. doctor blading).

It is envisioned in further embodiments to incorporate the mixture of phosphor and light reflective material mixture within the light transmissive window. For example the phosphor and light reflective material mixture can be mixed with a light transmissive polymer and the polymer/phosphor mixture extruded or injection molded to form the wavelength conversion component 14 with the phosphor and light reflective material homogeneously distributed throughout the volume of the component.

Locating the phosphor material remote to the LED provides a number of benefits namely reduced thermal degradation of the phosphor material. Additionally compared with devices in which the phosphor material is provided in direct contact with the light emitting surface of the LED die, providing the phosphor material remotely reduces absorption of backscattered light by the LED die. Furthermore locating the phosphor remotely enables generation of light of a more consistent color and/or CCT since the phosphor material is provided over a much greater area as compared to providing the phosphor directly to the light emitting surface of the LED die.

The phosphor material can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 "Europium activated silicate-based green phosphor" (assigned to Intematix Corp.), U.S. Pat. No. 7,601,276 "Two phase silicate-based yellow phosphor" (assigned to Intematix Corp.), U.S. Pat. No. 7,601,276 "Silicate-based orange phosphor" (assigned to Intematix Corp.) and U.S. Pat. No. 7,311,858 "Silicate-based yellow-green phosphor" (assigned to Intematix Corp.). The phosphor can also comprise an aluminate-based material such as is taught in our co-pending patent application US2006/0158090 "Aluminate-based green phosphor" and U.S. Pat. No. 7,390,437 "Aluminate-based blue phosphor" (assigned to Intematix Corp.), an aluminum-silicate phosphor as taught in co-pending application US2008/0111472 "Aluminum-silicate orange-red phosphor" or a nitride-based red phosphor material such as is taught in co-pending U.S. patent application Ser. No. 12/632, 550 filed Dec. 7, 2009. It will be appreciated that the phosphor material is not limited to the examples described herein and can comprise any phosphor material including nitride and/or sulfate phosphor materials, oxy-nitrides and oxy-sulfate phosphors or garnet materials (YAG).

The phosphor material comprises particles that are generally spherical in form with a diameter of 10 μm to 20 μm and typically of order 15 μm. The phosphor material can comprise particles of a size 2 μm to 60 μm.

The light reflective material 22 comprises a powdered material with a high reflectivity typically a reflectance of 0.9 or higher. The particle size of the light reflective material is typically in a range 0.1 μm to 10 μm and in a preferred embodiment is within a range 0.1 μm to 10 μm. The weight percent loading of light reflective material to phosphor material is in a range 0.1% to 10% and in a preferred embodiment in a range 1% to 2%. Examples of light reflective materials include magnesium oxide (MgO), titanium dioxide ($TiO_2$), barium sulfate ($BaSO_4$) and combinations thereof. The light reflective material can also comprise a white ink such as for example Norcote International Inc's super white ink GN-027SA which already includes particles of a highly light reflective material, typically $TiO_2$.

Figure 2:
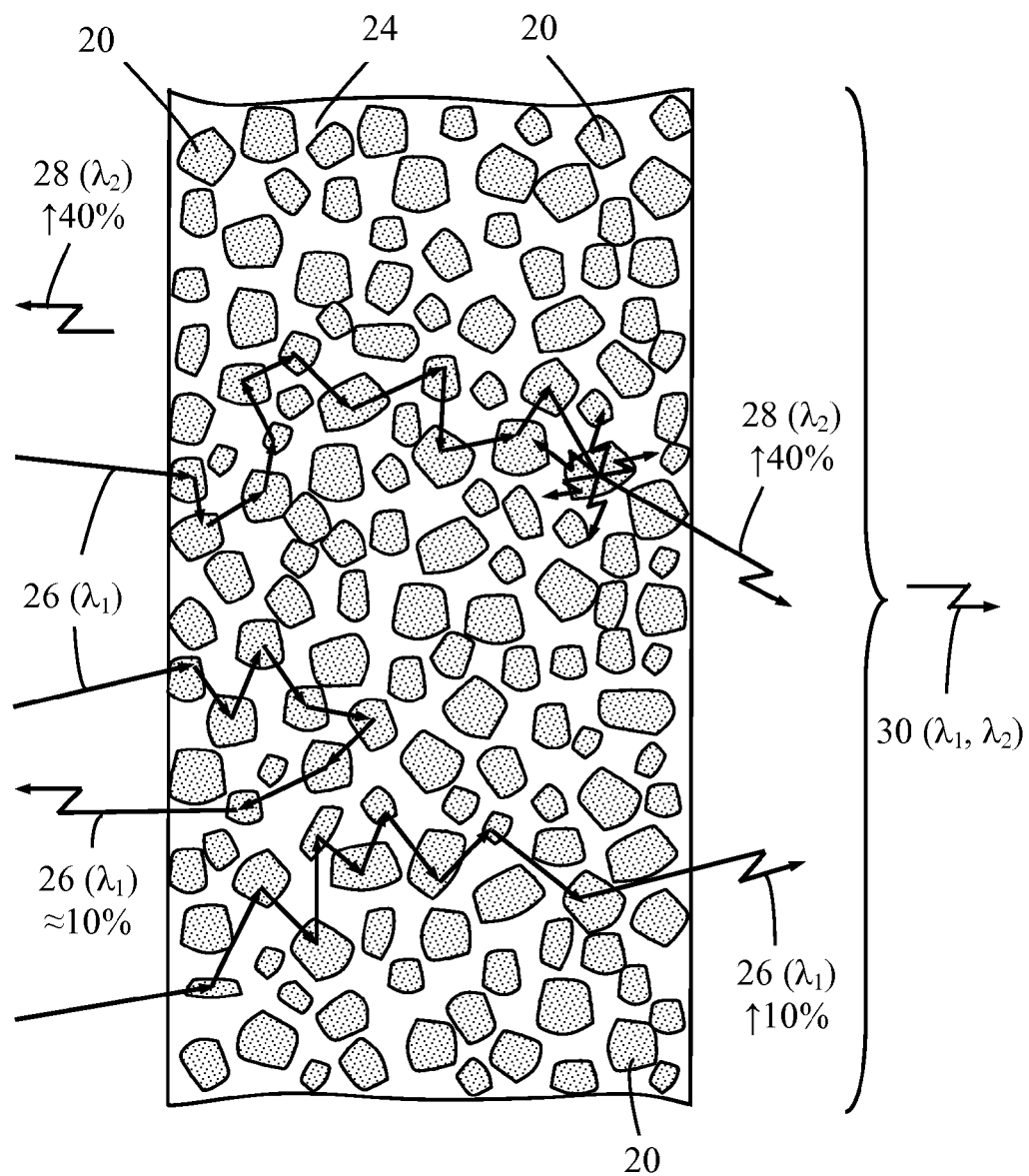
FIG. 2 is a schematic illustrating the principle of operation of a known light emitting device.

Before describing operation of the device of the invention, operation of a known light emitting device will be described with reference to FIG. 2 which shows a schematic of a cool white LED-based light emitting device that utilizes phosphor wavelength conversion. In common with the device of the invention the known device includes a wavelength conversion component 18 that includes phosphor material particles 20 homogeneously distributed throughout the volume of a light transmissive binder 24. Unlike the device of the invention the known devices do not include particles of a light reflective material. In operation blue light 26 from the LED is transmitted by the light transmissive binder 24 until it strikes a particle of phosphor material. It is believed that on average as little as 1 in a 10,000 interactions of a photon with a phosphor material particle results in absorption and generation of photoluminescence light. The majority, about 99.99%, of interactions of photons with a phosphor particle result in scattering of the photon. Due to the isotropic nature of the scattering process on average half the scattered photons will be in a direction back towards the LED. Tests indicate that typically about 10% of the total incident blue light is scattered and emitted from the wavelength conversion component in a direction back towards the LED. For a cool white light emitting device the amount of phosphor material is selected to allow approximately 10% of the total incident blue light to be emitted through the window and contribute to the emission product. The majority, approximately 80%, of the incident light is absorbed by the phosphor material and re-emitted as photoluminescence light 28. Due to the isotropic nature of photoluminescence light generation, approximately half of the light 28 generated by the phosphor material will be emitted in a direction towards the LED. As a result up to (↑) 40% of the total incident light will be emitted as light 28 of wavelength $\lambda_2$ and contributes to the emission product 30 whilst up to (↑) 40% of the total incident light will be emitted as light 28 of wavelength $\lambda_2$ in a direction back towards the LED. Typically light that is emitted towards the LED is re-directed by a reflector (not shown) to increase the overall efficacy of the device.

Operation of a cool white light emitting device 10 in accordance with some embodiments of the invention is now described with reference to FIG. 3 which shows a schematic of operation of the device of FIG. 1. The operation of the device of the invention is similar to that of FIG. 2 but additionally includes reflection or scattering of light (of wavelengths $\lambda_1$ and $\lambda_2$) by the particles of the light reflective/scattering material 22. By including particles of a light reflective material with the phosphor material this can reduce the amount of phosphor material required to generate a given color emission product, e.g. by up to 33% in some embodiments. It is believed that the particles of light reflective material increase the probability of photons striking a particle of phosphor material and thus for an emission product of a given color less phosphor material is required.

Figure 4:
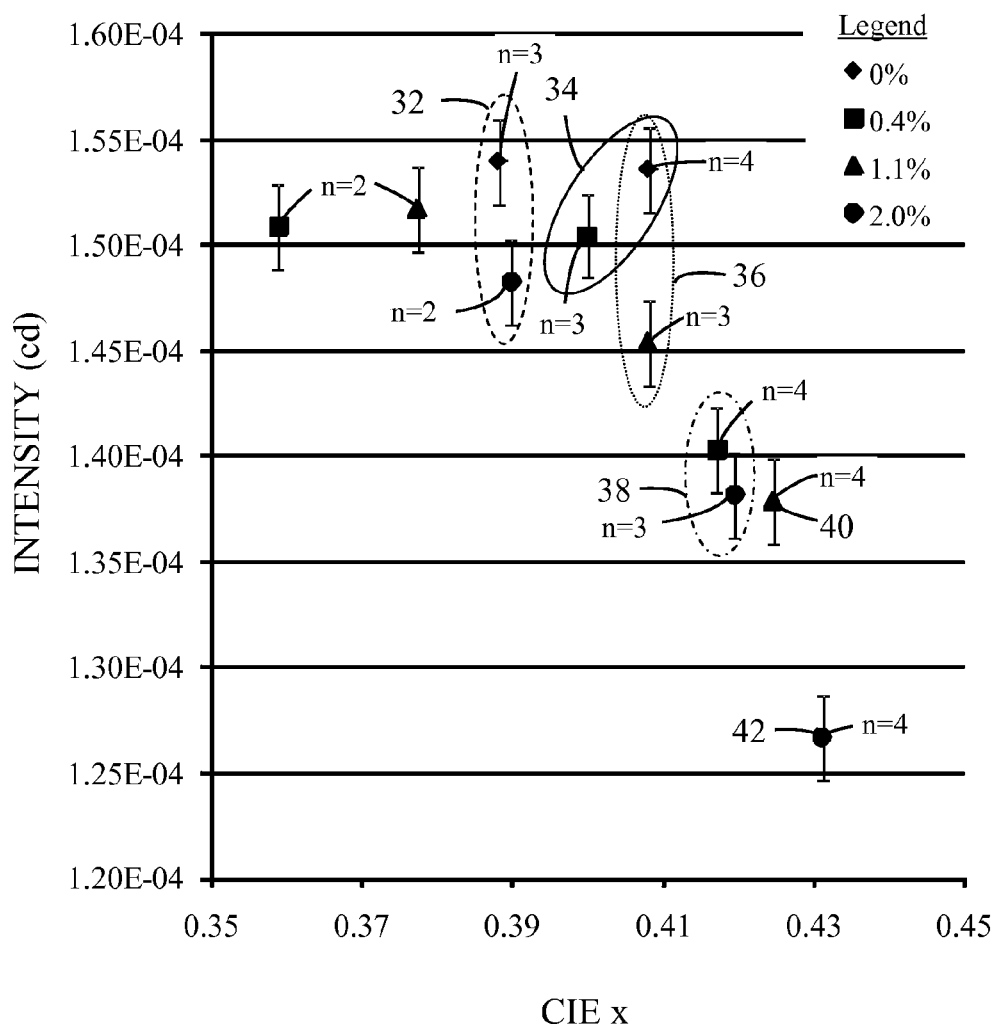
FIG. 4 is a plot of emission intensity versus chromaticity CIE x for an LED-based light emitting device in accordance with the invention for different weight percent loadings of light reflective material.

FIG. 4 is a plot of emission intensity versus chromaticity CIE x for a light emitting device in accordance with some embodiments of the invention for weight percent loadings of light reflective material of ♦—0%, ■—0.4%, ▲—1.1% and ●—2%. The data are for screen printed phosphor conversion layers in which the binder material comprises Nazdar's® UV curable litho clear overprint PSLC-294 and the phosphor material comprises Intematix Corporation's phosphor EY4453 with an average particle size of 15 μm. The ratio of phosphor material to clear ink is in a proportion of 2:1 by weight. The light reflective material comprises Norcote International Inc's super white ink GN-027SA. The figures for loading of light reflective material refer to weight percent of super white ink to clear ink. The smaller reference numerals associated with each data point indicate the number 'n' of print passes used to form the phosphor layer. It will be appreciated that the number of print passes is directly proportional to the thickness of the phosphor layer 18 and quantity of phosphor. The ovals 32, 34, 36, 38 are used to group data points for emission products that have substantially the same intensity and CIE x values. For example oval 32 indicates that an emission product of similar intensity and color can be produced for a phosphor conversion layers 18 comprising i) 3 print passes without light reflective material and ii) 2 print passes with a 2% loading of light reflective material. These data indicate that by the inclusion of a 2% weight loading of light reflective material it is possible to generate the same color and intensity of light using a phosphor conversion layer 18 that comprises about 33% less phosphor material. Oval 34 indicates that the same intensity and color of emission product is produced for a phosphor conversion layer comprising i) 4 print passes without light reflective material and ii) 3 print passes with a 0.4% loading of light reflective material. These data indicate that for this embodiment, by the inclusion of a 0.4% weight loading of light reflective material, the same color and intensity of light can be produced using a phosphor conversion layer comprising about 25% less phosphor. Oval 36 indicates that the same intensity and color of emission product is produced for a phosphor conversion layer comprising i) 4 print passes without light reflective material and ii) 3 print passes with a 1.1% loading of light reflective material. These data indicate that by the inclusion of a 1.1% weight loading of light reflective material the same color and intensity of light can be produced using a phosphor conversion layer comprising about 25% less phosphor. Oval 38 indicates that the same intensity and color of emission product is produced for a phosphor conversion layer comprising i) 4 print passes with a 0.4% weight loading of light reflective material and ii) 3 print passes with a 2% weight loading of light reflective material. These data indicate by the inclusion of a 0.4% weight loading of light reflective material that the same color and intensity of light can be produced using a phosphor conversion layer comprising about 25% less phosphor. Points 40 (n=4, 1.1% loading) and 42 (n=4, 2% loading) suggest that a saturation point exists above which an increase in light reflective material loading results in a decrease in emission intensity with little effect on the color.

Figure 5:
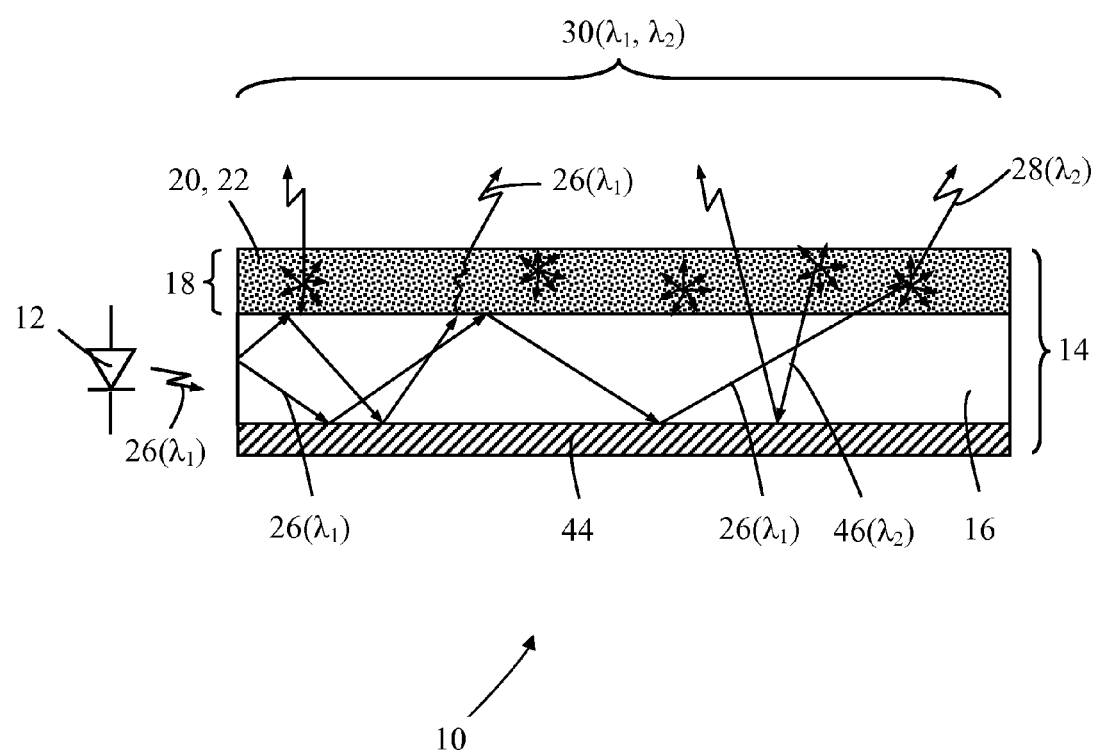
FIG. 5 is a schematic representation of an LED-based light emitting device in accordance with an alternative embodiment of the invention.

FIG. 5 is a schematic representation of an LED-based white light emitting device 10 in accordance with another embodiment of the invention. In this embodiment the light transmissive substrate 16 is configured as a light guide (waveguide) and the phosphor conversion layer 18 is provided over one face of the substrate, the light emitting face. Typically the substrate 16 is substantially planar and can be disc-shaped, square, rectangular or other shapes depending on the application. Where the substrate is disc-shaped the diameter can typically be between about 5 cm and 30 cm corresponding to a light emitting face of area of between about 20 cm$^2$ and about 700 cm$^2$. Where the substrate is square or rectangular in form the sides can typically be between about 5 cm and 40 cm corresponding to a light emitting face of between about 80 cm$^2$ and about 5000 cm$^2$. On the non-light emitting face (the lower face as illustrated) of the substrate 16 a layer of light reflective material 44 can be provided to prevent the emission of light from the rear of the device. The reflective material 44 can comprise a metallic coating such as chromium or a glossy white material such as a plastics material or paper. To minimize light being emitted from the edges of the substrate, the edges of the substrate preferably include a light reflective surface (not shown). One or more blue LEDs 12 are configured to couple blue light 26 into one or more edges of the substrate 16. In operation light 26 coupled into the substrate 16 is guided throughout the entire volume of the substrate 16 by total internal reflection. Light 26 striking the light emitting face of the substrate at angles above a critical angle will be emitted through the face and into the phosphor wavelength conversion layer 18. Operation of the device is the same as that described with reference to FIG. 3. As indicated in FIG. 5 phosphor generated light 46 emitted in directions away from the light emitting face can re-enter the substrate 16 and will eventually be emitted through the light emitting face by being reflected by the light reflective layer 44. The final illumination product 30 emitted from the device is the combination of the blue light 26 generated by the LED and wavelength converted light 28 generated by the phosphor wavelength conversion layer 18.

Figure 6:
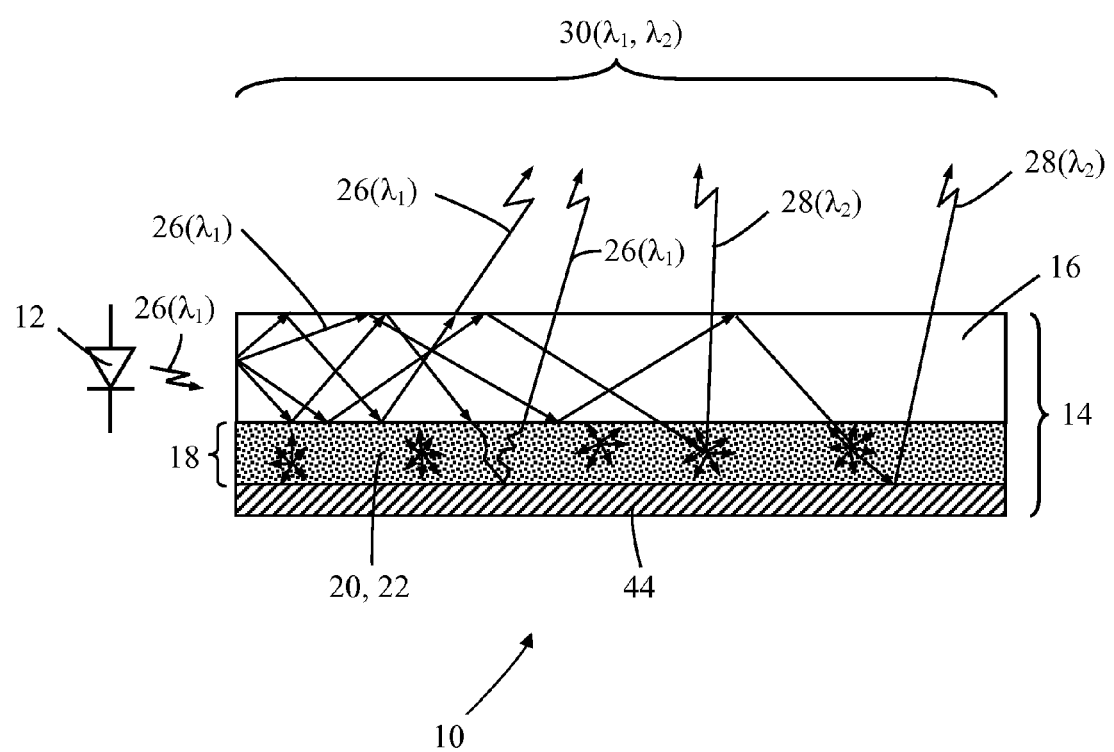
FIG. 6 is a schematic representation of an LED-based light emitting device in accordance with a another embodiment of the invention.

FIG. 6 is a schematic representation of an alternative LED-based white light emitting device 10 in which the light transmissive substrate 16 is configured as a light guide (waveguide). In this embodiment the phosphor conversion layer 18 is provided on the face of the substrate that is opposite to the light emitting face and the light reflective layer 44 is provided over the phosphor conversion layer 18.

Figure 7:
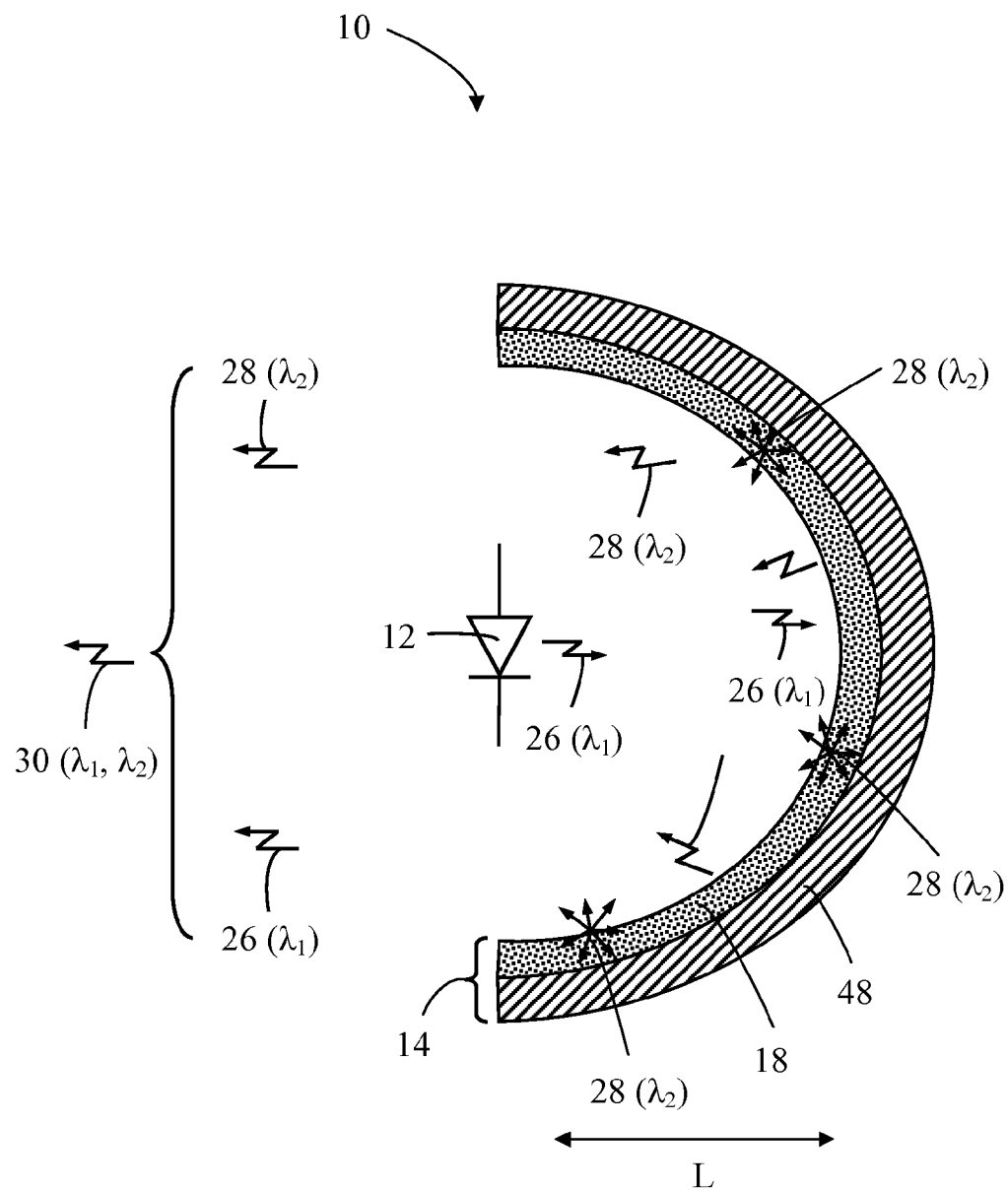
FIG. 7 is a schematic representation of an LED-based light emitting device in accordance with a further embodiment of the invention.

FIG. 7 shows a schematic representation of an LED-based white light emitting device 10 in accordance with a further embodiment of the invention. In this embodiment the wavelength conversion component 14 is light reflective and comprises a light reflective surface 48 on which the phosphor conversion layer 18 is applied. As shown the light reflective surface 48 can comprise a paraboloidal surface though it can comprise any surface including planar, convex and concave surfaces. To maximize light emission from the device, the light reflective surface is as reflective as possible and preferably has a reflectance of at least 0.9. The light reflective surface can comprise a polished metallic surface such as silver, aluminum, chromium; a light reflective polymer, a light reflective paper or a light reflective paint. To assist in the dissipation of heat the light reflective surface is preferably thermally conductive.

Figure 3:
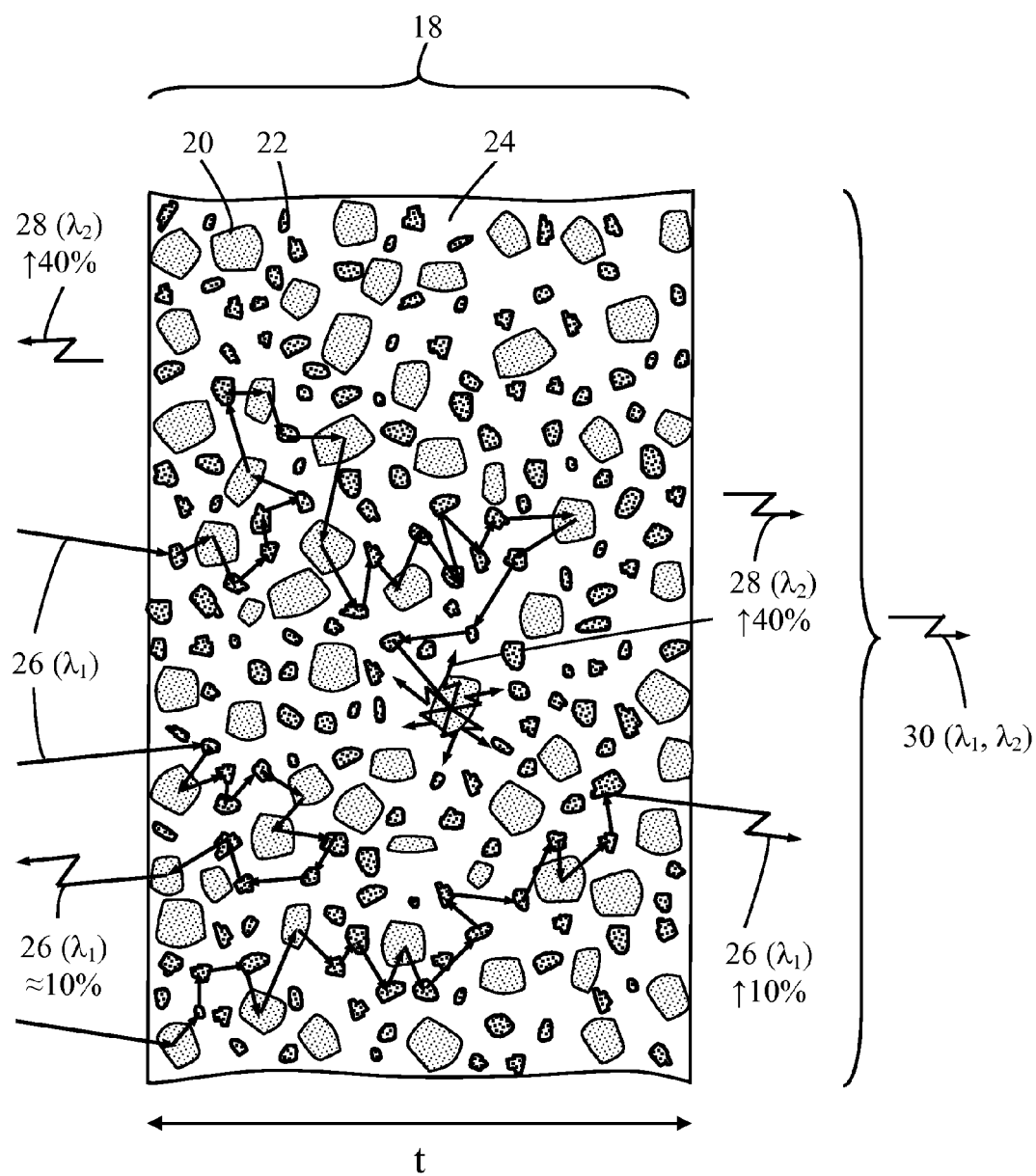
FIG. 3 is a schematic illustrating the principle of operation of the light emitting device of FIG. 1.
Figure 8:
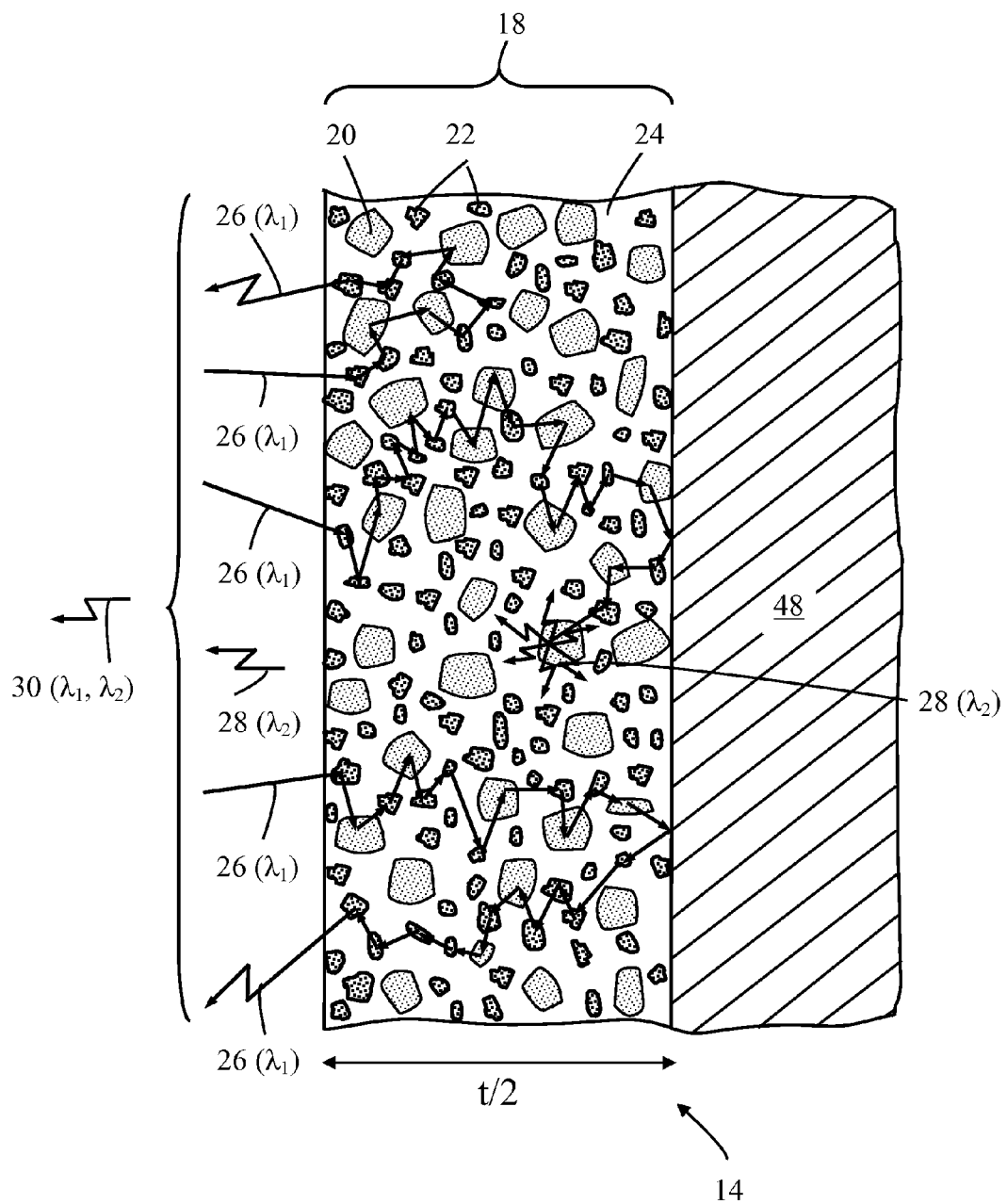
FIG. 8 is a schematic illustrating the principle of operation of the light emitting device of FIG. 7.

Operation of the light emitting device of FIG. 7 is illustrated in FIG. 8 and is not described in detail as it is similar to that of FIG. 3. However it is to be appreciated that since on average up to half of the LED light 26 will travel through the phosphor conversion layer twice, the thickness of the phosphor conversion layer 18 can be of up to half, i.e. t/2, compared to arrangements with a light transmissive wavelength conversion component (FIGS. 1 and 5). As a result of providing the phosphor material on a light reflective surface the same color of emission product can be achieved with a further potential reduction of up to about 50% in phosphor material usage. It will be appreciated that the embodiment of FIG. 6 is similar in terms of operation to that of FIG. 7 with the light transmissive substrate 16 being used to guide LED light 26 to the phosphor conversion layer 18.

Whilst the invention has been described in relation to light emitting devices the principles of the invention also apply to solid-state light emitting signage that utilize photoluminescence wavelength conversion to generate a desired color of emitted light such as those disclosed in co-pending United States patent application US 2007/0240346 A1, to Li et al., the specification of which is incorporated herein by way of reference thereto. It will be appreciated that in such light emitting signs the wavelength conversion component 14 can be used as the photoluminescence signage surface to generate signage information of a desired color. The mixture of phosphor material and light reflective material can be configured as a pattern to define an image, picture, letter, numeral, device, pattern or other signage information on the light transmissive substrate. Alternatively, as for example is required for channel lettering, the shape of the signage surface, that is the light transmissive substrate, can be configured to define signage information. The invention is particularly advantageous in signage applications where the area of the signage surface is many hundreds of square centimeters requiring the phosphor material to be distributed over a minimum area of 100 cm$^2$ (10 cm by 10 cm) and more typically over many hundreds or even thousands of square centimeters.

The signs can be backlit, that is the LEDs are located behind the signage surface within for example a light box, and the signage surface provided overlaying the light box opening. Typically the signage surface is located at a distance of at least about 5 mm from the LEDs. Alternatively the sign can be edge lit and the light transmissive substrate configured as a light guide and the mixture of phosphor material and light reflective material provided on at least a part of a light emitting face of the light guide.

In some embodiments, the light reflective material comprises titanium dioxide (TiO$_2$) though it can comprise other materials such as barium sulfate (BaSO$_4$), magnesium oxide (MgO), silicon dioxide (SiO$_2$) or aluminum oxide (Al$_2$O$_3$). In some embodiments, the light reflective material has an average particle size in a range 1 μm to 50 μm and more preferably in a range 10 μm to 20 μm.

In some embodiments, the light reflective/scattering material that is utilized within the wavelength conversion component has a particle size that is selected such that the particles will scatter excitation (typically blue) light relatively more than they will scatter light generated by the photoluminescence (phosphor) material(s). For example, the light reflective particle size may be selected such that the particles will scatter excitation light relatively at least twice as much as they will scatter light generated by the at least one phosphor material. This ensures that a higher proportion of the blue excitation light will be scattered, increasing the probability of the photon interacting with a phosphor material particle and resulting in the generation of photoluminescence light. At the same time phosphor generated light can pass through with a lower probability of being scattered.

Since this approach can further increase the probability of blue photons interacting with a phosphor material particle, less phosphor material is required to generate a selected emission color. This arrangement can also increase luminous efficacy of the wavelength conversion component/device. In some embodiments employing blue (400 nm to 480 nm) excitation light, the light reflective material has an average particle size of less than about 150 nm and typically has an average particle size in a range 100 nm to 150 nm.

The light reflective/scattering material (i.e. for preferentially scattering blue light) may be embedded within the same layer of material as the phosphor material.

Figure 9:
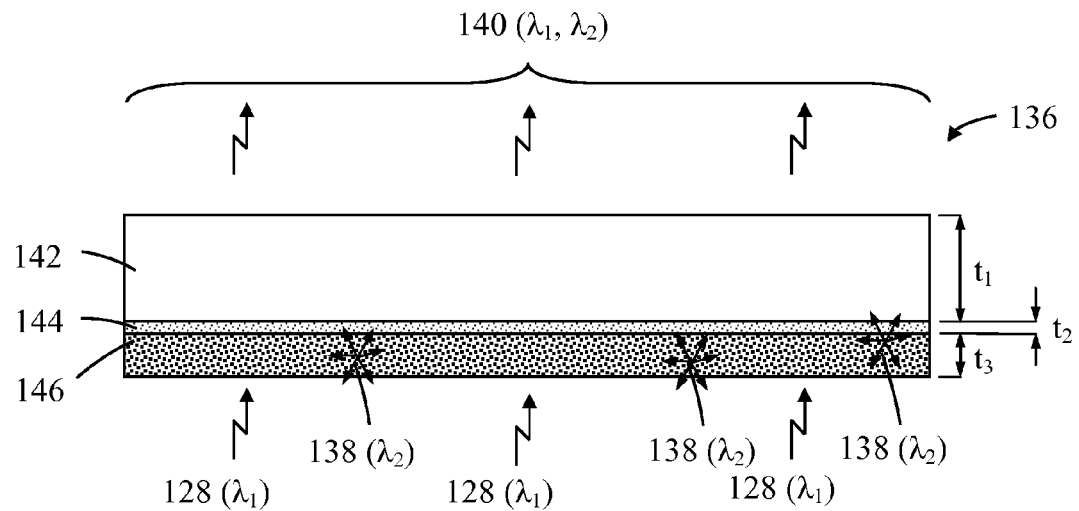
FIG. 9 is a schematic of a phosphor wavelength conversion component in accordance with an embodiment of the invention.

Alternatively, light reflective/scattering material may be placed onto a separate layer that is adjacent to or nearby the layer having the phosphor material. For example, In accordance with some embodiments of the invention and as shown in FIG. 9 the wavelength conversion component 136 comprises, in order, a light transmissive substrate 142, a light reflective layer 144 containing light reflective particles and a wavelength conversion layer 146 containing a mixture of one or more phosphor (photoluminescence) and light reflective materials. As can be seen in FIG. 9 the wavelength conversion component 136 is configured such that in operation the wavelength conversion layer 146 faces the LEDs. In accordance with some embodiments of the invention the wavelength conversion component 136 can comprises, in order, a light transmissive substrate 142, a light reflective layer 144 containing light reflective particles and a wavelength conversion layer 146 containing a one or more phosphor (photoluminescence) materials.

The light transmissive substrate 142 can be any material that is substantially transmissive to light in a wavelength range 380 nm to 740 nm and can comprise a light transmissive polymer such as a polycarbonate or acrylic or a glass such as a borosilicate glass. The substrate 142 in some embodiments comprise a planar circular disc of diameter ($\phi$=62 mm and thickness $t_1$ which is typically 0.5 mm to 3 mm. In other embodiments the substrate can comprise other geometries such as being convex or concave in form such as for example being dome shaped or cylindrical.

The light diffusing layer 144 comprises a uniform thickness layer of particles of a light reflective material, preferably titanium dioxide ($TiO_2$). In alternative arrangements the light reflective material can comprise barium sulfate ($BaSO_4$), magnesium oxide (MgO), silicon dioxide ($SiO_2$), aluminum oxide ($Al_2O_3$) or a powdered material with as high a reflectivity as possible, typically a reflectance of 0.9 or higher. The light reflective material powder is thoroughly mixed in known proportions with a light transmissive liquid binder material to form a suspension and the resulting mixture deposited onto the face of the substrate 142 preferably by screen printing to form a uniform layer of thickness $t_2$ (typically in a range 10 μm to 75 μm) that covers the entire face of the substrate. The quantity of light diffracting material per unit area in the light diffusing layer 144 will typically in a range 10 μg.cm$^{-2}$ to 5 mg.cm$^{-2}$.

Whilst screen printing is a preferred method for depositing the light diffusing layer 144, it can be deposited using other techniques such as for example slot die coating, spin coating, roller coating, drawdown coating or doctor blading. The binder material can comprise a curable liquid polymer such as a polymer resin, a monomer resin, an acrylic, an epoxy (poly-epoxide), a silicone or a fluorinated polymer. It is important that the binder material is, in its cured state, substantially transmissive to all wavelengths of light generated by the phosphor material(s) and the LEDs and preferably has a transmittance of at least 0.9 over the visible spectrum (380 nm to 800 nm). The binder material is preferably U.V. curable though it can be thermally curable, solvent based or a combination thereof. U.V. or thermally curable binders can be preferable because, unlike solvent-based materials, they do not "outgas" during polymerization. In one arrangement the average particle size of the light diffractive material is in a range 5 μm to 15 μm though as described above it can be in a nanometer range (nm) and is advantageously in a range 100 nm to 150 nm. The weight percent loading of light reflective material to liquid binder is typically in a range 7% to 35%.

The wavelength conversion layer 146 is deposited in direct contact with the light diffusing layer 144 that is without any intervening layers or air gaps. The phosphor material, which is in powder form, is thoroughly mixed in known proportions with a liquid light transmissive binder material to form a suspension and the resulting phosphor composition, "phosphor ink", deposited directly onto the reflective layer 144. The wavelength conversion layer is preferably deposited by screen printing though other deposition techniques such as slot die coating, spin coating or doctor blading can be used. To eliminate an optical interface between the wavelength conversion and reflective layers 146, 144 and to maximize the transmission of light between layers, the same liquid binder material is preferably used to fabricate both layers; that is, a polymer resin, a monomer resin, an acrylic, an epoxy, a silicone or a fluorinated polymer.

Figure 10:
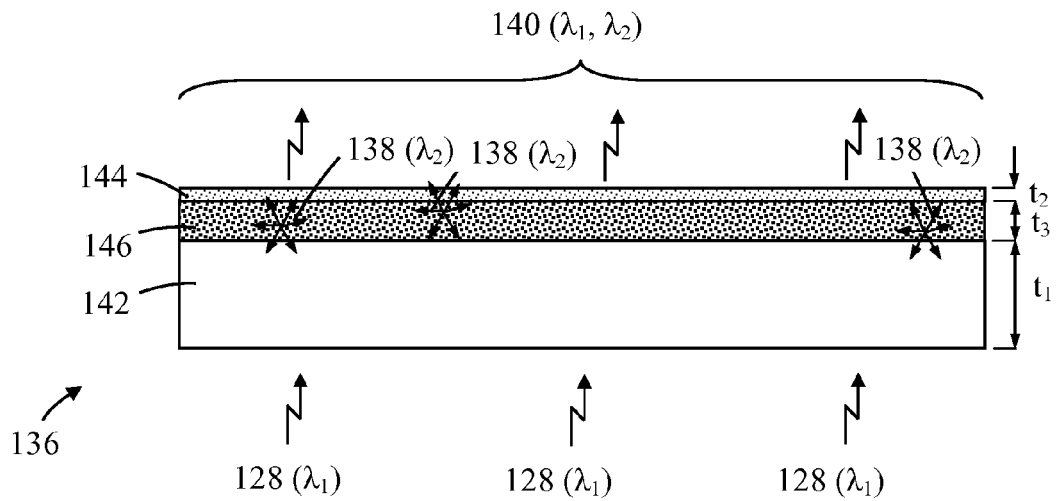
FIG. 10 is a schematic of a phosphor wavelength conversion component in accordance with another embodiment of the invention.

A further example of a phosphor wavelength conversion component 136 in accordance with the invention is illustrated in FIG. 10. In common with the wavelength conversion component of FIG. 9 the component comprises a light transmissive substrate 142, a light diffusing layer 144 and a wavelength conversion layer 146. In accordance with the invention the light diffusing and wavelength conversion layers 144, 146 are deposited in direct contact with one another. Again in operation the component is configured such that the wavelength conversion component is configured such that the wavelength conversion layer 146 faces the LEDs.

In operation blue excitation light 128 generated by the LEDs travels through the wavelength conversion layer 146 until it strikes a particle of phosphor material. It is believed that on average as little as 1 in 10,000 interactions of a photon with a phosphor material particle results in absorption and generation of photo luminescence light 138. The majority, about 99.99%, of interactions of photons with a phosphor particle result in scattering of the photon. Due to the isotropic nature of the scattering process on average half of the photons will scattered in a direction back towards the LEDs. Tests indicate that typically about 10% of the total incident blue light 128 is scattered and emitted from the wavelength conversion component 136 in a direction back towards the LEDs. For a cool white light emitting device the amount of phosphor material is selected to allow approximately 10% of the total incident blue light to be emitted from the wavelength conversion component and contribute to the emission product 140. The majority, approximately 80%, of the incident light is absorbed by the phosphor material and re-emitted as photo luminescence light 138. Due to the isotropic nature of photo luminescence light generation, approximately half of the light 138 generated by the phosphor material will be emitted in a direction towards the LED. As a result only up to about 40% of the total incident light will be emitted as light 138 of wavelength $\lambda_2$ and contributes to the emission product 138 with the remaining (up to about 40%) of the total incident light being emitted as light 138 of wavelength $\lambda_2$ in a direction back towards the LED. Light emitted towards the LEDs from the wavelength conversion component 136 is re-directed by the light reflective surfaces of a reflection chamber to contribute to the emission product and to increase the overall efficiency of the device.

The addition of a light diffusing layer 144 composed of particles of a light reflective material can substantially reduce the quantity of phosphor material required to generate a selected color of emitted light. The diffusing layer 144 increases the probability that a photon will result in the generation of photoluminescence light by reflecting light back into the wavelength conversion layer 146. Inclusion of a reflective layer in direct contact with the wavelength conversion layer can reduce, the quantity of phosphor material required to generate a given color emission product, e.g. by up to 40% in some embodiments.

Therefore, it is envisioned to configure the light diffusing layer such that it selectively scatters blue excitation light generated by the LEDs more than it scatters light generated by the phosphor material. Such a light diffusing layer ensures that a higher proportion of the blue light emitted from the wavelength conversion layer will be scattered and directed by the light reflective material back into the wavelength conversion layer increasing the probability of the photon interacting with a phosphor material particle and resulting in the generation of photoluminescence light. At the same time phosphor generated light can pass through the diffusing layer with a lower probability of being scattered. Since the diffusing layer increases the probability of blue photons interacting with a phosphor material particle less phosphor material is needed to generate a selected emission color.

Figure 11:
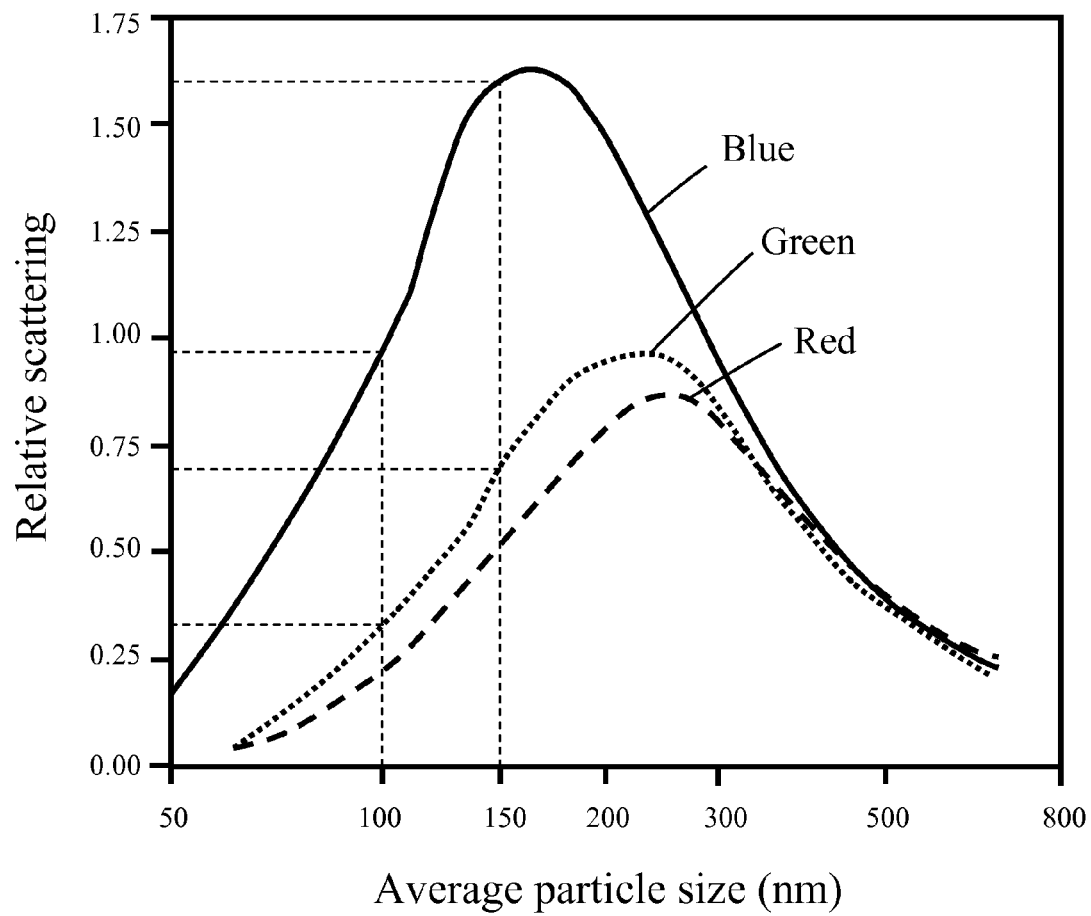
FIG. 11 shows plots of relative light scattering versus light diffractive particle size (nm) for red, green and blue light.

In addition, such an arrangement can also increase luminous efficacy of the wavelength conversion component/device. By appropriate selection of the average particle size of the light scattering material it is possible to configure the light diffusing layer such that it scatters blue light more readily than other colors, namely green and red. FIG. 11 shows plots of relative light scattering versus $TiO_2$ average particle size (nm) for red, green and blue light. As can be seen from FIG. 11 $TiO_2$ particles with an average particle size of 100 nm to 150 nm are more than twice as likely to scatter blue light (450 nm to 480 nm) than they will scatter green light (510 nm to 550 nm) or red light (630 nm to 740 nm). For example $TiO_2$ particles with an average particle size of 100 nm will scatter blue light nearly three times (2.9=0.97/0.33) more than it will scatter green or red light. For $TiO_2$ particles with an average particle size of 200 nm these will scatter blue light over twice (2.3=1.6/0.7) as much as they will scatter green or red light. In accordance with some embodiments of the invention the light diffractive particle size is preferably selected such that the particles will scatter blue light relatively at least twice as much as light generated by the phosphor material(s). The concept of a wavelength conversion component including a light reflective layer comprised of light reflective particles that preferentially scatter light corresponding to wavelengths generated by the LEDs compared with light of wavelengths generated by the phosphor material is considered inventive in its own right.

Therefore, the light reflective/scattering material may be embodied in a separate layer that is adjacent to, or near, a layer that includes the phosphor material. The separate light reflective layer may be used instead of, and/or in addition to, mixing light reflective/scattering material into the same layer as the phosphor material. Either the same, or different reflective materials, may be used in the separate light reflective layer from the light reflective material that is mixed with the phosphor material.

Figure 12:
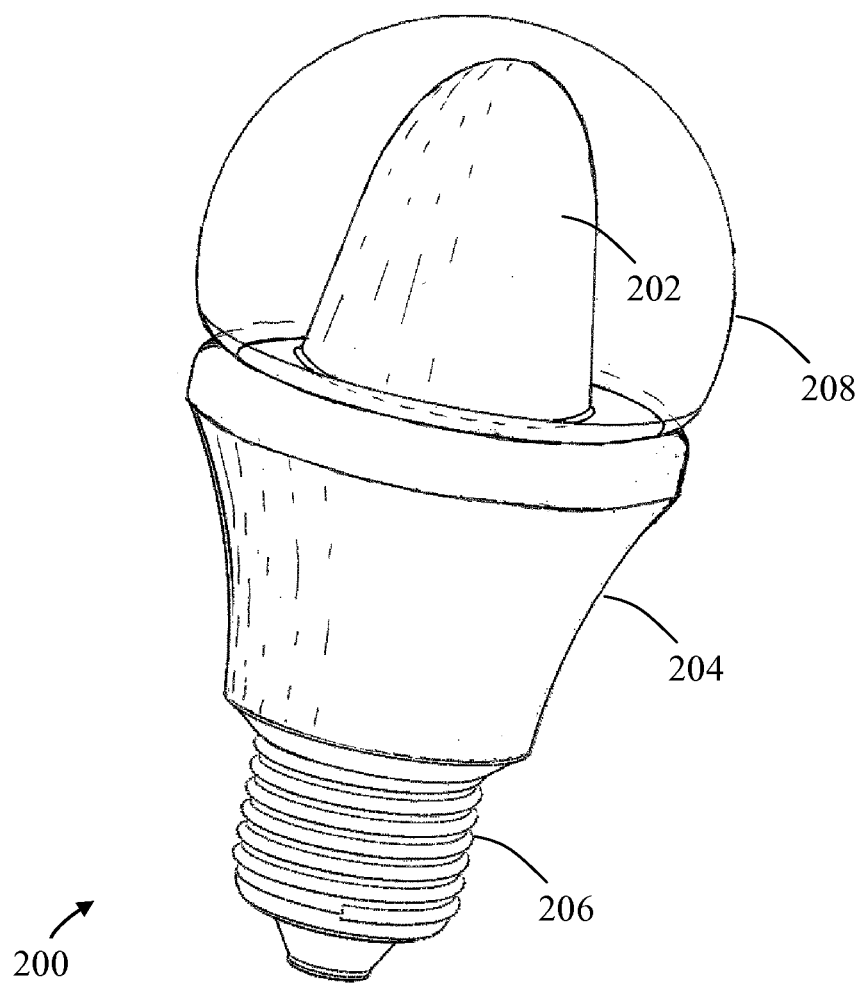
FIG. 12 illustrates an LED-based light emitting device in accordance with a further embodiment of the invention.
Figure 13:
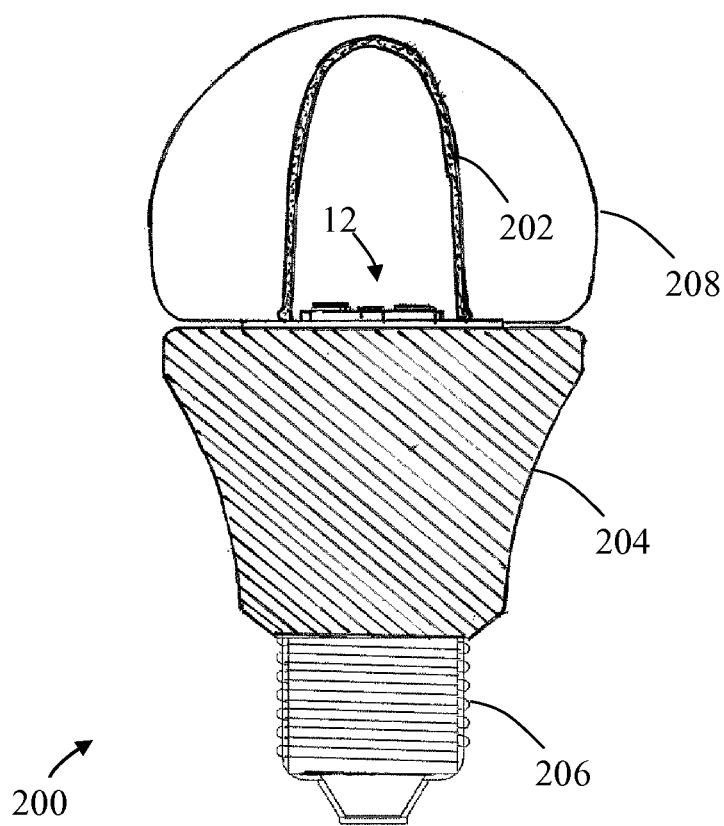
FIG. 13 illustrates a cross-sectional view of the LED-based light emitting device of FIG. 12 in accordance with a further embodiment of the invention.

The inventive concepts disclosed herein may be applied to wavelength conversion components that encompass any suitable shape. For example, consider the LED lighting device 200 illustrated in FIGS. 12 and 13 which shows a solid-state light bulb for replacing an incandescent light bulb.

The LED lighting device 200 comprises a lighting base 204 that includes a screw base 206. Screw base 206 is configured to fit within standard light bulb sockets, e.g. implemented as a standard Edison screw base. An envelope 208 may extend around the upper portion of the LED lighting device 200. The envelope 208 is a light-transmissive material (e.g. glass or plastic) that provides protective and/or diffusive properties for the LED lighting device 200.

LED lighting device 200 comprises a wavelength conversion component 202 having an elongated dome shape that extends from a lighting base 204. The blue LED device 12 resides on the top surface of the lighting base 204, beneath the wavelength conversion component 202. The three-dimensional nature of the wavelength conversion component 202 creates a relatively large shape that surrounds the volume around and above the LEDs 12. Using three-dimensional shapes for the wavelength conversion component 202 in a lighting device 200 allows for certain functional advantages, such as the ability to perform light shaping for the light emitted by the lighting device 200.

However, these types of three-dimensional shapes for the wavelength conversion component 202 also correspond to a relatively large volume for the wavelength conversion component which needs to be populated with adequate amounts of the phosphor materials. With prior art approaches, a significantly large amount of phosphor material would therefore be required to manufacture such wavelength conversion components 202. Embodiments of the invention may be employed to reduce the amount of phosphor needed to manufacture such wavelength conversion components 202. In particular, the wavelength conversion component 202 comprises a mixture of phosphors and a reflective material. Since the reflective material within the wavelength conversion component 202 has the property of scattering light, this reduces the amount of phosphor material that is needed for the wavelength conversion component 202.

In some embodiments, a light diffusing layer (not shown) may be added to the wavelength conversion component 202 (in addition to and/or instead of the reflective material mixed with the phosphors) to reduce the amount of phosphor material required to manufacture the wavelength conversion component 202. Any suitable material may be employed for the light reflective material, such as light scattering particles that are selected to be small enough to more likely scatter blue light.

Therefore, what has been described is an improved approach for implementing LED-based lighting devices and/or wavelength conversion components that reduce the amount of photo-luminescent materials needed to manufacture such devices and components.

It will be appreciated that light emitting devices in accordance with the invention are not limited to the exemplary embodiments described and that variations can be made within the scope of the invention. For example whilst the invention has been described in relation to LED-based light emitting devices the invention also applies to devices based on other solid-state light emitters including solid-state lasers and laser diodes.

What is claimed is:

1. A light emitting device comprising:
   at least one solid-state light emitter operable to generate excitation light, wherein the excitation light comprises blue light having a wavelength of greater than or equal to 440 nm; and
   a photoluminescence wavelength conversion component comprising a mixture of particles of at least one photoluminescence material and particles of a light reflective material, wherein the photoluminescence wavelength conversion component is configured such that in operation a portion of the excitation light generated by the at least one solid-state light emitter is emitted through the photoluminescence wavelength conversion component to contribute to the a final visible emission product.

2. The light emitting device of claim 1, wherein an area over which the mixture of photoluminescence material and light reflective material is distributed is at least fifty times the light emitting area of the light emitter.

3. The light emitting device of claim 1, wherein the wavelength conversion component is locatable at a distance of at least 5 mm from the at least one light emitter.

4. The light emitting device of claim 1, wherein the light reflective material has a particle size in a range selected from the group consisting of: 0.01 µm to 10 µm; 0.01 µm to 1 µm and 0.1 µm to 1 µm.

5. The light emitting device of claim 1, wherein a weight percent loading of light reflective material to the at least one photoluminescence material is in a range selected from the group consisting of: 0.01% to 10%; 0.01% to 1%; 0.1% to 1% and 0.5% to 1%.

6. The light emitting device of claim 1, wherein the light reflective material is selected from the group consisting of: magnesium oxide, titanium dioxide, barium sulfate and combinations thereof.

7. The light emitting device of claim 1, wherein the wavelength conversion component is selected from the group consisting of: a light transmissive substrate on which the mixture of photoluminescence material and light reflective material is provided as at least one layer; a light transmissive substrate configured as a light guide and wherein the mixture of photoluminescence material and light reflective material is provided on at least a part of a face of the light guide; a light transmissive substrate having the mixture of photoluminescence material and light reflective material homogeneously distributed throughout its volume and a light reflective surface on which the mixture of the photoluminescence material and light reflective material are provided as at least one layer.

8. The light emitting device of claim 1, wherein the at least one solid-state light emitter comprises an LED that is operable to generate blue excitation light having a peak wavelength in a wavelength range 440 nm to 480 nm.

9. The light emitting device of claim 1, wherein the mixture of the photoluminescence material and the light reflective material is distributed over an area of at least 0.8 $cm^2$.

10. The light emitting device of claim 1, wherein the particles of the light reflective material corresponds to a particle size such that the particles scatter excitation light relatively more than light generated by the at least one phosphor material.

11. The light emitting device of claim 1, further comprising a light diffusing layer that is adjacent to the photoluminescence wavelength conversion component.

12. The light emitting device of claim 11, in which the light diffusing layer comprises particles of light reflective material corresponding to a particle size such that the particles scatter excitation light relatively more than light generated by the at least one photoluminescence material.

13. The light emitting device of claim 12, wherein the light reflective material has a particle size in a range 100 nm to 150 nm.

14. The light emitting device of claim 1, in which the at least one photoluminescence material comprises phosphor or quantum dots.

15. The light emitting device of claim 1, configured as a light emitting sign.

16. A wavelength conversion component for a solid-state light emitting device comprising a mixture of particles of at least one photoluminescence material and particles of a light reflective material, wherein the wavelength conversion component is configured such that in operation a portion of an excitation light is emitted through the wavelength conversion component to contribute to the a final visible emission product, wherein the excitation light comprises blue light having a wavelength of greater than or equal to 440 nm.

17. The wavelength conversion component of claim 16, wherein the light reflective material has a particle size in a range selected from the group consisting of: 0.01 µm to 10 µm; 0.01 µm to 1 µm and 0.1 µm to 1 µm.

18. The wavelength conversion component of claim 16, wherein a weight percent loading of light reflective material to the at least one photoluminescence material is in a range selected from the group consisting of: 0.01% to 10%; 0.01% to 1%; 0.1% to 1% and 0.5% to 1%.

19. The wavelength conversion component of claim 16, wherein the wavelength conversion component is selected from the group consisting of: a light transmissive substrate on which the mixture of the at least one photoluminescence material and light reflective material are provided as at least one layer; a light transmissive substrate configured as a light guide and wherein the mixture of photoluminescence material and light reflective material is provided on at least a part of a face of the light guide; a light transmissive substrate having the mixture of photoluminescence material and light reflective material homogeneously distributed throughout its volume and a light reflective surface on which the mixture of the photoluminescence material and light reflective material are provided as at least one layer.

20. The wavelength conversion component of claim 16, wherein the mixture of the at least one photoluminescence material and the light reflective material are distributed over an area of at least 0.8 $cm^2$.

21. The wavelength conversion component of claim 16, wherein the particles of the light reflective material corresponds to a particle size such that the particles scatter excitation light relatively more than light generated by the at least one phosphor material.

22. The wavelength conversion component of claim 21, wherein the light reflective material has a particle size in a range 100 nm to 150 nm.

23. The wavelength conversion component of claim 16, further comprising a light diffusing layer that is adjacent to the photoluminescence wavelength conversion component.

24. The wavelength conversion component of claim 23, in which the light reflective layer comprises particles of light reflective material corresponding to a particle size such that the particles scatter excitation light relatively more than light generated by the at least one phosphor material.

* * * * *

UNITED STATES PATENT AND TRADEMARK OFFICE
CERTIFICATE OF CORRECTION

PATENT NO. : 8,610,340 B2
APPLICATION NO. : 13/253031
DATED : December 17, 2013
INVENTOR(S) : Yuan et al.

It is certified that error appears in the above-identified patent and that said Letters Patent is hereby corrected as shown below:

Specification

Col. 2, line 4-5, delete, "US 2008/02118992", and replace with --US 2008/0218992--.

Signed and Sealed this
Third Day of June, 2014

Michelle K. Lee
*Deputy Director of the United States Patent and Trademark Office*